United States Patent
Wendt et al.

(10) Patent No.: US 11,062,923 B2
(45) Date of Patent: Jul. 13, 2021

(54) APPARATUS TO CONTROL TRANSFER PARAMETERS DURING TRANSFER OF SEMICONDUCTOR DEVICES

(71) Applicant: Rohinni, LLC, Coeur d'Alene, ID (US)

(72) Inventors: Justin Wendt, Post Falls, ID (US);
Cody Peterson, Hayden, ID (US);
Andrew Huska, Liberty Lake, WA (US)

(73) Assignee: Rohinni, LLC, Coeur d'Alene, ID (US)

( * ) Notice: Subject to any disclaimer, the term of this patent is extended or adjusted under 35 U.S.C. 154(b) by 266 days.

(21) Appl. No.: 16/146,833

(22) Filed: Sep. 28, 2018

(65) Prior Publication Data
US 2020/0105551 A1    Apr. 2, 2020

(51) Int. Cl.
| | |
|---|---|
| B23P 19/00 | (2006.01) |
| H01L 21/67 | (2006.01) |
| H01L 21/683 | (2006.01) |
| H01L 21/677 | (2006.01) |
| H01L 23/00 | (2006.01) |
| H01L 33/48 | (2010.01) |

(52) U.S. Cl.
CPC ...... *H01L 21/67132* (2013.01); *H01L 21/677* (2013.01); *H01L 21/67144* (2013.01); *H01L 21/6836* (2013.01); *H01L 24/75* (2013.01); *H01L 33/48* (2013.01); *H01L 2221/68363* (2013.01); *H01L 2221/68386* (2013.01); *H01L 2224/75262* (2013.01); *H01L 2224/75303* (2013.01); *H01L 2224/75804* (2013.01); *H01L 2224/75824* (2013.01); *Y10T 29/53174* (2015.01)

(58) Field of Classification Search
CPC ............. Y10T 428/25; Y10T 428/2861; Y10T 29/49826; Y10T 29/53174; Y10T 29/53178; Y10T 29/5313; H05K 2203/0195
USPC .................. 29/739, 729, 740, 741, 743, 832
See application file for complete search history.

(56) References Cited

U.S. PATENT DOCUMENTS

| | | | |
|---|---|---|---|
| 10,062,588 B2* | 8/2018 | Huska | ............... H01L 21/67144 |
| 2008/0124842 A1* | 5/2008 | Wang | ..................... H01L 24/97 |
| | | | 438/118 |
| 2018/0122672 A1 | 5/2018 | Chang et al. | |

FOREIGN PATENT DOCUMENTS

| | | |
|---|---|---|
| KR | 20090070926 A | 7/2009 |
| WO | WO2018136645 A1 | 7/2018 |

OTHER PUBLICATIONS

The PCT Search Report and Written Opinion dated Dec. 12, 2019, for PCT Application No. PCT/US2019/053190, 7 pages.

(Continued)

*Primary Examiner* — Thiem D Phan
(74) *Attorney, Agent, or Firm* — Lee & Hayes, P.C.

(57) ABSTRACT

An apparatus includes a transfer mechanism to transfer an electrically-actuatable element directly from a wafer tape to a transfer location on a circuit trace on a product substrate. The transfer mechanism includes one or more transfer wires. Two or more stabilizers disposed on either side of the one or more transfer wires. A needle actuator is connected to the one or more transfer wires and the two or more stabilizers to move the one or more transfer wires and the two or more stabilizers to a die transfer position.

8 Claims, 20 Drawing Sheets

(56) References Cited

OTHER PUBLICATIONS

The Chinese Office Action dated Feb. 7, 2021 for Chinese Patent Application No. 201980027568.3, a counterpart of U.S. Appl. No. 16/146,833, 6 pages.

* cited by examiner

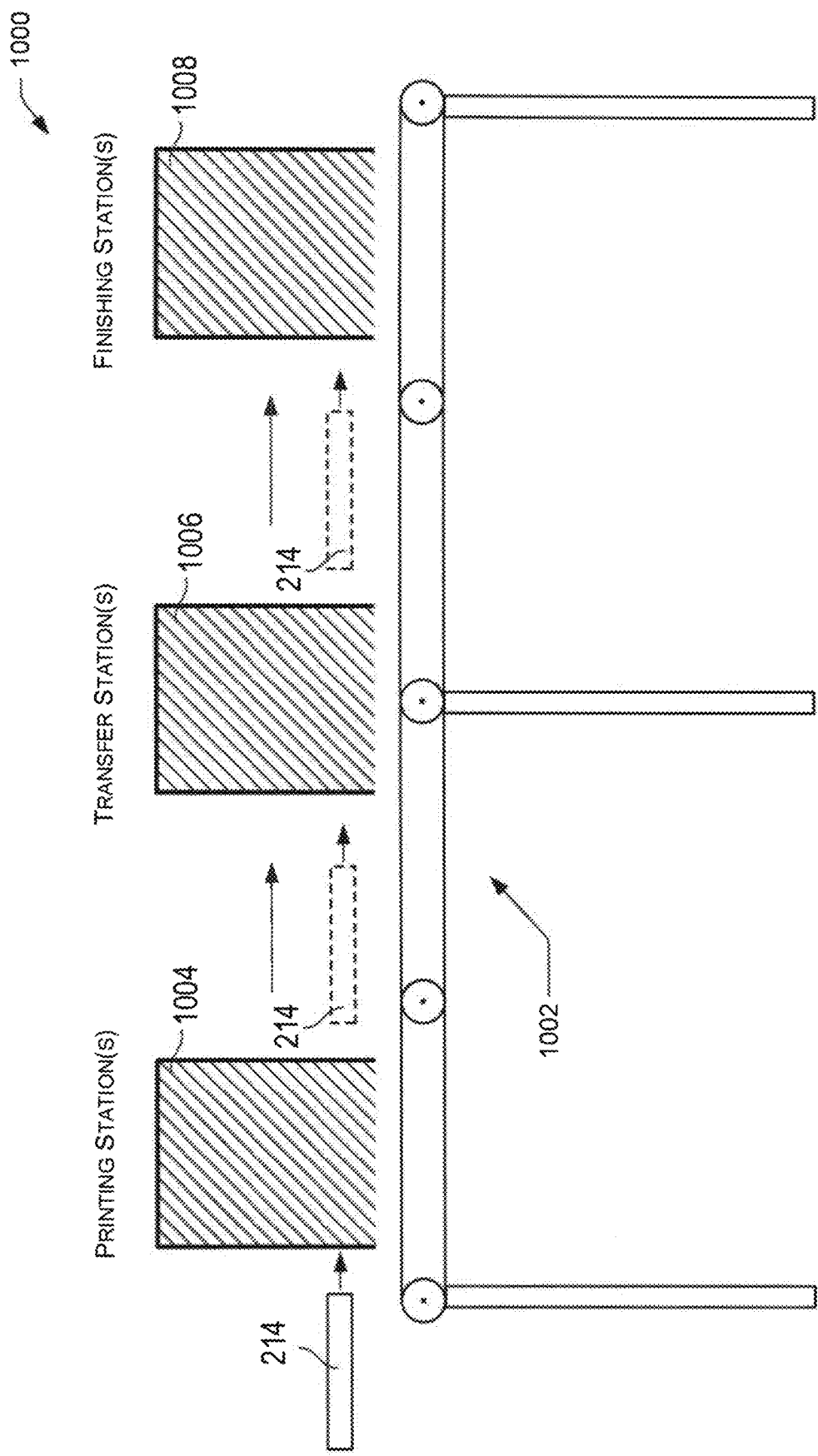

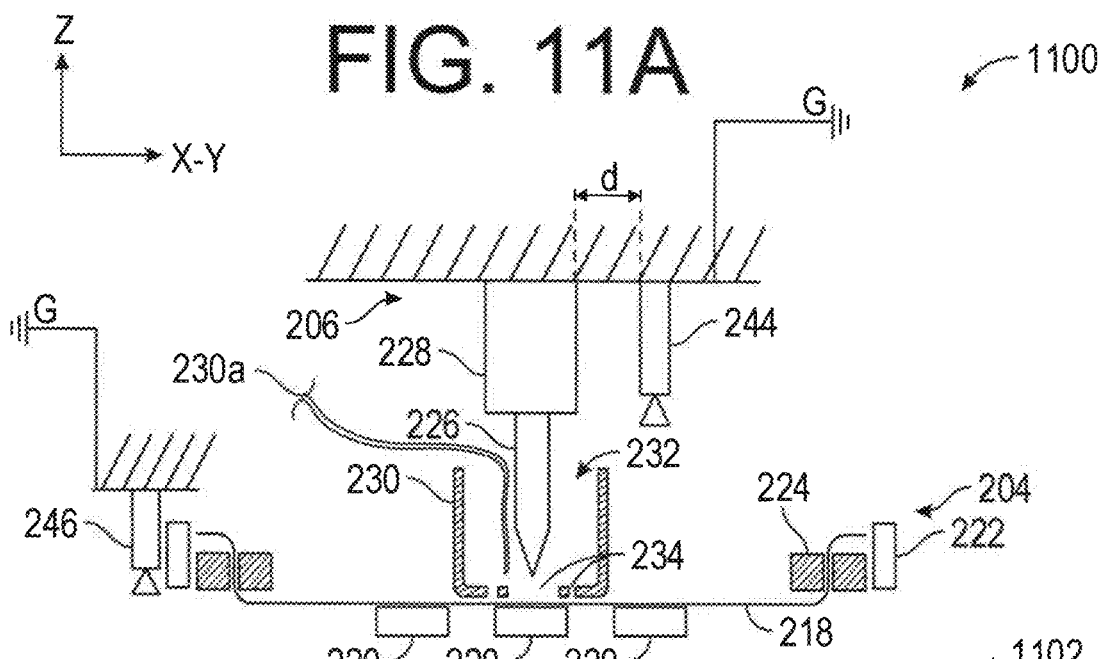
FIG. 11A
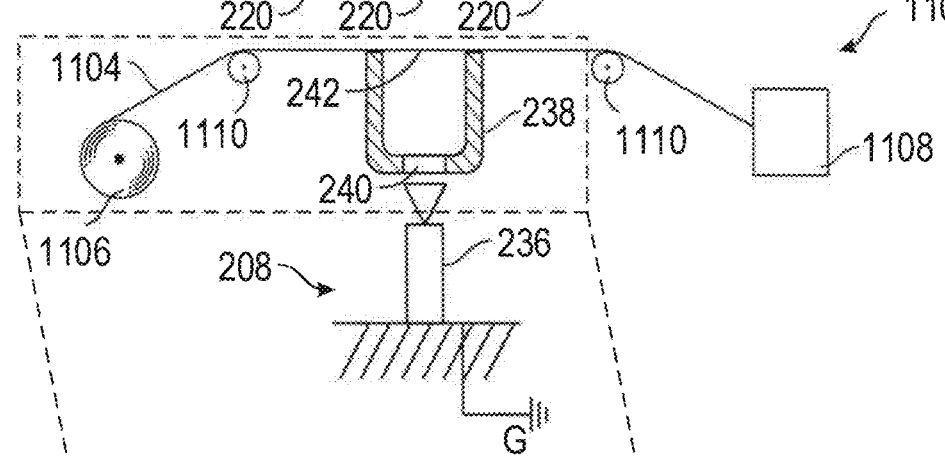
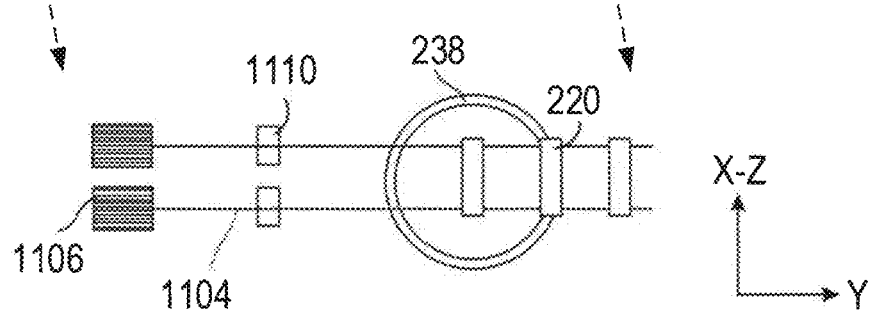
FIG. 11B

APPARATUS TO CONTROL TRANSFER PARAMETERS DURING TRANSFER OF SEMICONDUCTOR DEVICES

CROSS REFERENCE TO RELATED PATENT APPLICATIONS

This application incorporates by reference U.S. patent application Ser. No. 14/939,896, filed on Nov. 12, 2014, entitled "Apparatus for Transfer of Semiconductor Devices," now issued as U.S. Pat. No. 9.633,883; U.S. patent application Ser. No. 15/343,055, filed on Nov. 3, 2016, entitled "Compliant Needle for Direct Transfer of Semiconductor Devices;" U.S. patent application Ser. No. 15/360,471, filed on Nov. 23, 2016, entitled "Top-Side Laser for Direct Transfer of Semiconductor Devices;" U.S. patent application Ser. No. 15/360,645, filed on Nov. 23, 2016, entitled "Pattern Array Direct Transfer Apparatus and Method Therefor;" U.S. patent application Ser. No. 15/409,409, filed on Jan. 18, 2017, entitled "Flexible Support Substrate for Transfer of Semiconductor Devices," now issued as U.S. Pat. No. 10,062,588.

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

As mentioned previously, a single semiconductor wafer may be diced to create more than 100,000 or even 1,000,000 die from the semiconductor wafer. As such, efficiency is a primary concern when transferring thousands, if not millions, of die. In transferring these die, there are often parameters of a die transfer that a manufacturer may not have control over for the sake of efficiency and/or speed. For example, if a die is transferred at a relatively high speed, the high speed transfer process may cause vibrations to travel throughout the semiconductor substrate. Furthermore, if an adhesive is used to couple the die to the substrate, a transfer process will be slowed by the time necessary for a die to peel from the substrate. Conventional transfer mechanisms and methods do not provide the ability to control and/or improve these parameters and others without decreasing the efficiency of the transfer process.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

FIG. 10 illustrates an embodiment of a direct transfer apparatus and process implementing a conveyor system.

FIG. 11A illustrates a schematic view of another embodiment of a transfer apparatus in a pre-transfer position.

FIG. 11B illustrates a schematic top view of the support substrate conveyance mechanism post-transfer operation of the embodiment in FIG. 11A.

DETAILED DESCRIPTION

Figure 1:
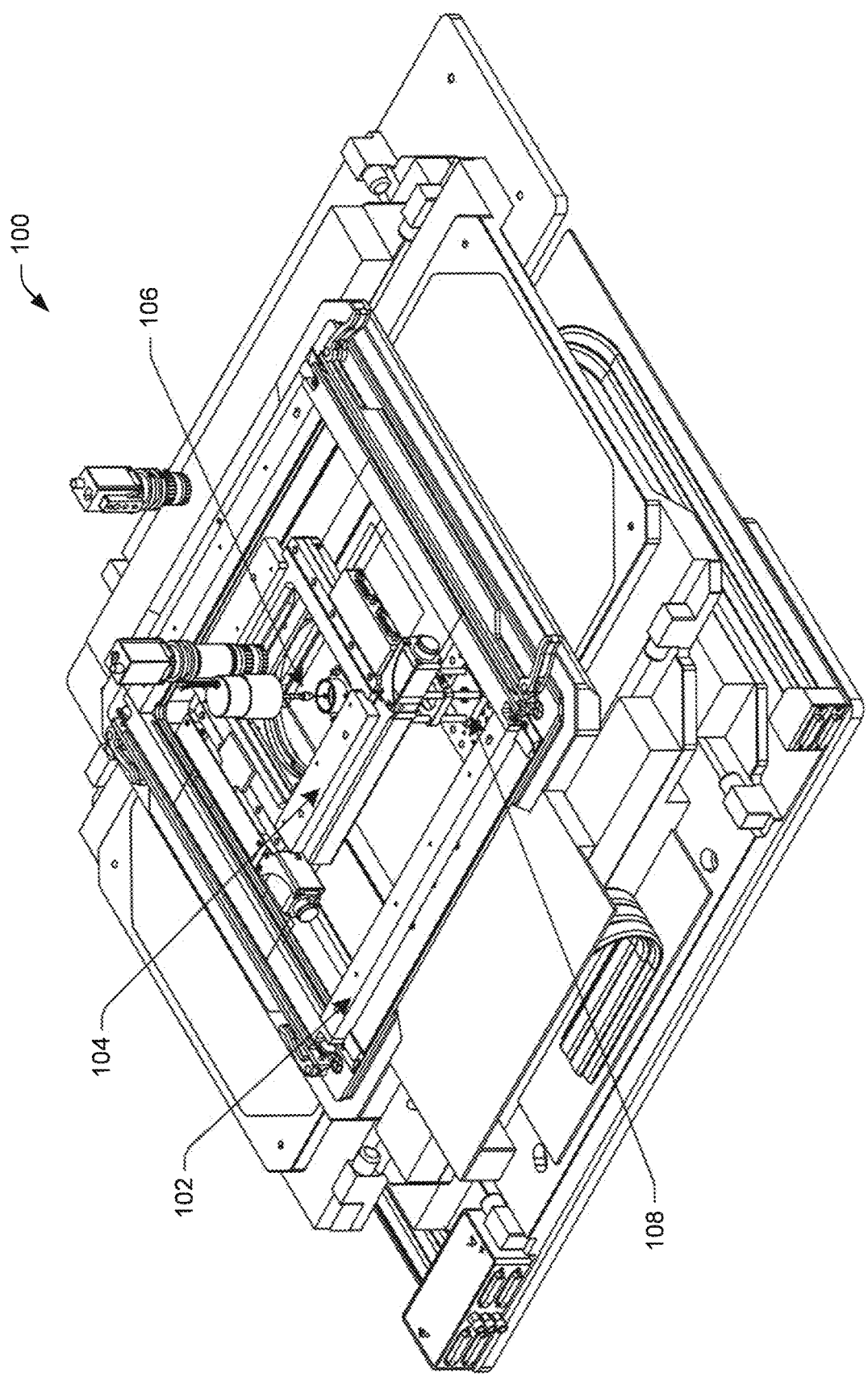
FIG. 1 illustrates an isometric view of an embodiment of a transfer apparatus.

This disclosure is directed to a machine that directly transfers and affixes semiconductor device die to a circuit and to the process for achieving the same, as well as to the circuit having die affixed thereto (as the output product). In some instances, the machine functions to transfer unpackaged die directly from a substrate such as a "wafer tape" to a support substrate, such as a circuit substrate. The direct transfer of unpackaged die may significantly reduce the thickness of an end product compared to a similar product produced by conventional means, as well as the amount of time and/or cost to manufacture the support substrate.

For the purpose of this description, the term "substrate" refers to any substance on which, or to which, a process or action occurs. Further, the term "product" refers to the desired output from a process or action, regardless of the state of completion. Thus, a support substrate refers to any substance on which, or to which, a process or action is caused to occur for a desired output.

In an embodiment, the machine may secure a support substrate for receiving "unpackaged" die, such as LEDs, transferred from the wafer tape, for example. In an effort to reduce the dimensions of the products using the die, the die are very small and thin, for example, a die may be about 50 microns thick. Due to the relatively small size of the die, the machine includes components that function to precisely align both the wafer tape carrying the die and the support substrate to ensure accurate placement and/or avoid product material waste. In some instances, the components that align the support substrate and the die on the wafer tape may include a set of frames in which the wafer tape and the support substrate are secured respectively and conveyed individually to a position of alignment such that a specific die on the wafer tape is transferred to a specific spot on the support substrate.

The frame that conveys the support substrate may travel in various directions, including horizontal directions and/or vertical directions, or even directions that would permit transfer to a curved surface. The frame that conveys the wafer tape may travel in various directions also. A system of gears, tracks, motors, and/or other elements may be used to secure and convey the frames carrying the support substrate and the wafer tape respectively to align the support substrate with the wafer tape in order to place a die on the correct position of the support substrate. Each frame system may also be moved to an extraction position in order to facilitate extraction of the wafer tape and the support substrate upon completion of the transfer process.

In some instances, the machine may further include a transfer mechanism for transferring the die directly from the wafer tape to the support substrate without "packaging" the die. The transfer mechanism may be disposed vertically above the wafer tape so as to press down on the die via the wafer tape toward the support substrate. This process of pressing down on the die may cause the die to peel off of the wafer tape, starting at the sides of the die until the die separate from the wafer tape to be attached to the support substrate. That is, by reducing the adhesion force between the die and the wafer tape, and increasing the adhesion force between the die and the support substrate, the die may be transferred.

In some embodiments, the transfer mechanism may include an elongated rod, such as a pin or needle that may be cyclically actuated against the wafer tape to push the wafer tape from a top side. Additionally, and/or alternatively, the transfer mechanism may include a plurality of needles that may be individually actuated against the wafer tape. The needle, or needles, may be sized so as to be no wider than a width of the die being transferred. Although in other instances, the width of the needle may be wider than a width of the die, or any other dimension. When the end of the needle contacts the wafer tape, the wafer tape may experience a local deflection at the area between the die and the wafer tape. Inasmuch as the deflection is highly localized and rapidly performed, the portion of the wafer tape that does not receive pressure from the needle may begin to flex away from the surface of the die. This partial separation may thus cause the die to lose sufficient contact with the wafer tape, so as to be released from the wafer tape. Moreover, in some instances, the deflection of the wafer tape may be so minimal, as to maintain an entirety of the surface area of the die in contact with the wafer tape, while still causing the opposing surface of the die to extend beyond a plane of extension of the corresponding surface of the adjacent die to avoid unintentional transfer of the adjacent die.

Alternatively, or additionally, the machine may further include a fixing mechanism for affixing the separated, "unpackaged" die to the support substrate. In some instances, the support substrate may have thereon a circuit trace to which the die are transferred and affixed. The fixing mechanism may include a device that emits energy, such as a laser, to melt/soften the material of the circuit trace on the support substrate. Moreover, in some instances, the laser may be used to activate/harden the material of the circuit trace. Thus, the fixing mechanism may be actuated before, and/or after the die is in contact with the material of the circuit trace. Accordingly, upon actuation of the transfer mechanism to release a die onto the support substrate, the energy emitting device may also be activated so as to prepare the trace material to receive the die. The activation of the energy emitting device may further enhance the release and capture of the die from the wafer tape so as to begin formation of a semiconductor product on the support substrate.

First Example Embodiment of a Direct Transfer Apparatus

FIG. 1 illustrates an embodiment of an apparatus 100 that may be used to directly transfer unpackaged semiconductor components (or "die") from a wafer tape to a support substrate. The wafer tape may also be referred to herein as the semiconductor device die substrate, or simply a die substrate. The apparatus 100 may include a support substrate conveyance mechanism 102 and a wafer tape conveyance mechanism 104. Each of the support substrate conveyance mechanism 102 and the wafer tape conveyance mechanism 104 may include a frame system or other means to secure the respective substrates to be conveyed to desired alignment positions with respect to each other. The apparatus 100 may further include a transfer mechanism 106, which, as shown, may be disposed vertically above the wafer tape conveyance mechanism 104. In some instances, the transfer mechanism 106 may be located so as to nearly contact the wafer tape. Additionally, the apparatus 100 may include a fixing mechanism 108. The fixing mechanism 108 may be disposed vertically beneath the support substrate conveyance mechanism 102 in alignment with the transfer mechanism 106 at a transfer position, where a die may be placed on the support substrate. As discussed below, FIGS. 2A and 2B illustrate example details of the apparatus 100.

Figure 2A:
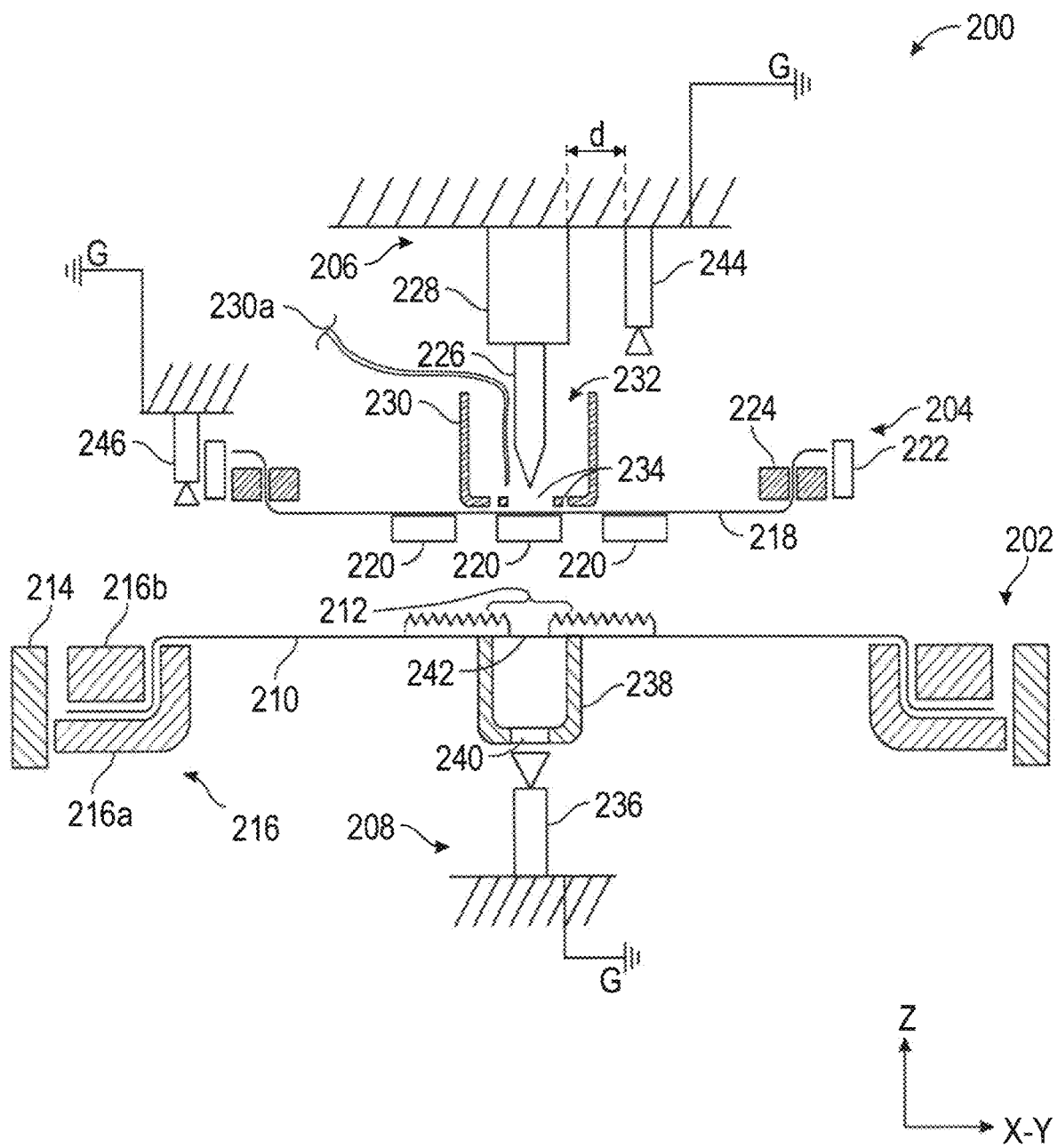
FIG. 2A represents a schematic view of an embodiment of a transfer apparatus in a pre-transfer position.
Figure 2B:
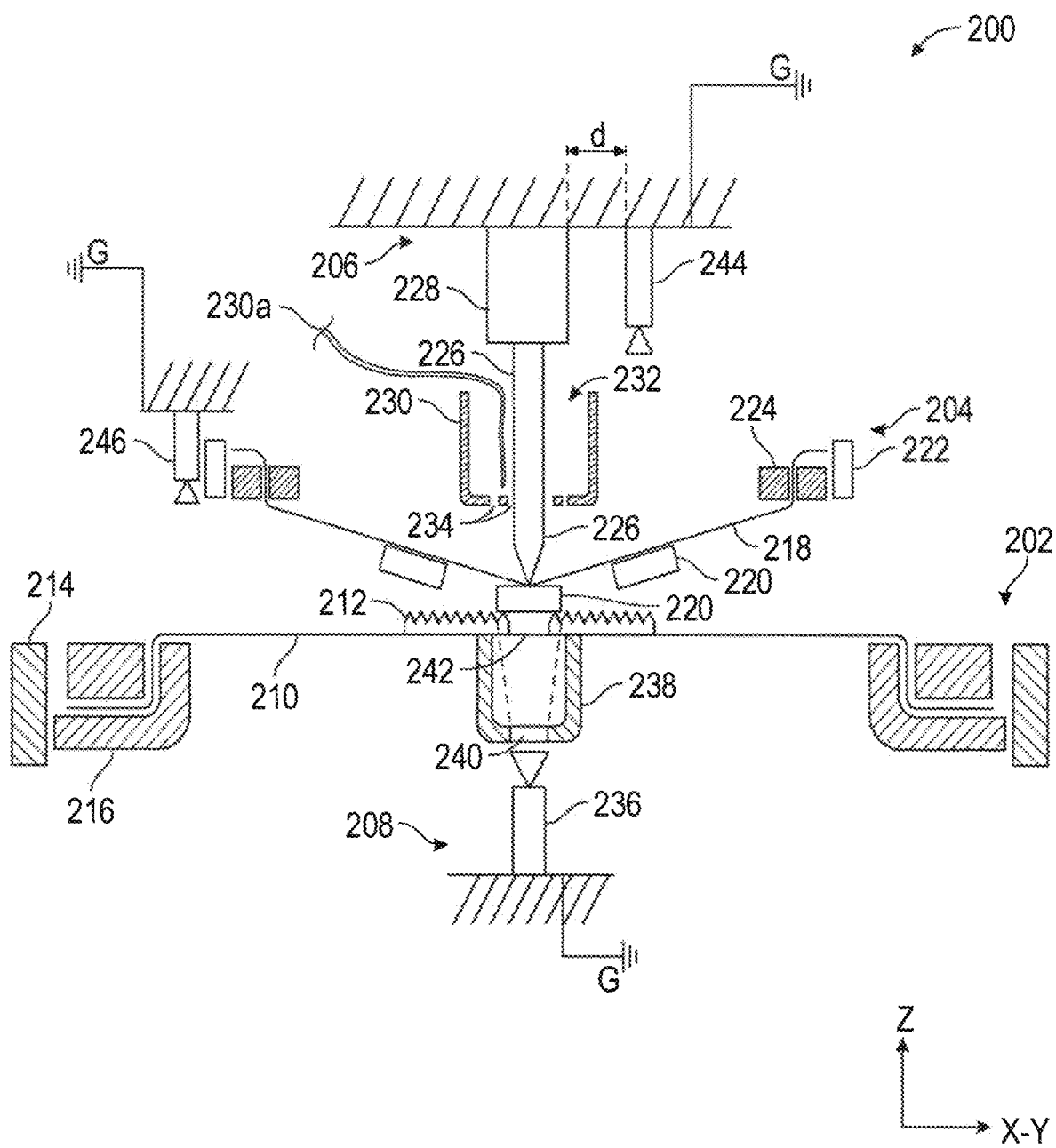
FIG. 2B represents a schematic view of an embodiment of a transfer apparatus in a transfer position.

Inasmuch as FIGS. 2A and 2B depict different stages of the transfer operation, while referring to the same elements and features of apparatus 200, the following discussion of specific features may refer interchangeably to either or both of FIGS. 2A and 2B, except where explicitly indicated. In particular, FIGS. 2A and 2B illustrate an embodiment of an apparatus 200, including a support substrate conveyance mechanism 202, a wafer tape conveyance mechanism 204, a transfer mechanism 206, and a fixing mechanism 208. The support substrate conveyance mechanism 202 may be disposed adjacent to the wafer tape conveyance mechanism 204. For example, as illustrated, the support substrate conveyance mechanism 202 may extend in a substantially horizontal direction and may be disposed vertically beneath the wafer tape conveyance mechanism 204 so as to take advantage of any effect that gravity may have in the transfer process. Alternatively, the support substrate conveyance mechanism 202 may be oriented so as to extend transversely to a horizontal plane.

During a transfer operation, the conveyance mechanisms 202, 204 may be positioned such that a space between a surface of a support substrate carried by the support substrate conveyance mechanism 202 and a surface of a wafer tape carried by the wafer tape conveyance mechanism 204 may be more or less than 1mm, depending on various other aspects of the apparatus 200, including the amount of deflection that occurs by components during the transfer operation, as described herein below. In some instances, the respective opposing surfaces of the wafer tape and the support substrate may be the most prominent structures in comparison to the supporting structures of the conveyance mechanisms 202, 204. That is, in order to avoid a collision between components of the machine and products thereon, which might be caused by movable parts (e.g., the conveyance mechanisms 202, 204), a distance between the respective surfaces of the wafer tape and support substrate may be less than a distance between either of the surfaces and any other opposing structural component.

As depicted, and in some instances, the transfer mechanism 206 may be disposed vertically above the wafer tape conveyance mechanism 204, and the fixing mechanism 208 may be disposed vertically beneath the support substrate conveyance mechanism 202. It is contemplated that in some embodiments, one or both of the transfer mechanism 206 and the fixing mechanism 208 may be oriented in different positions than the positions illustrated in FIGS. 2A and 2B. For example, the transfer mechanism 206 may be disposed so as to extend at an acute angle with respect to a horizontal plane. In another embodiment, the fixing mechanism 208 may be oriented to emit energy during the transfer process from the same direction of actuation as the transfer mechanism 206, or alternatively, from any orientation and position from which the fixing mechanism 208 is able to participate in the transfer process.

The support substrate conveyance mechanism 202 may be used to secure a support substrate 210. Herein, the term "support substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; and a cloth material of cotton, nylon, rayon, leather, etc. The choice of material of the support substrate may include durable materials, flexible materials, rigid materials, and other materials with which the transfer process is successful and which maintain suitability for the end use of the support substrate. The support substrate 210 may be formed solely or at least partially of conductive material such that the support substrate 210 acts as a conductive circuit for forming a product. The potential types of support substrate may further include items, such as glass bottles, vehicle windows, or sheets of glass.

In an embodiment as depicted in FIGS. 2A and 2B, the product substrate 248 may include a circuit trace 212 disposed thereon. The circuit trace 212, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of the circuit trace 212 may be sized according to the size of the die being transferred to ensure proper connectivity and subsequent activation of the die. For example, the circuit trace 212 may have a trace spacing, or gap ranging from about 75 to 200 microns, about 100 to 175 microns, or about 125 to 150 microns.

The circuit trace 212 may be formed from a conductive ink disposed via screen printing, inkjet printing, laser printing, manual printing, or other printing means. Further, the circuit trace 212 may be pre-cured and semi-dry or dry to provide additional stability, while still being activatable for die conductivity purposes. A wet conductive ink may also be used to form the circuit trace 212, or a combination of wet and dry ink may be used for the circuit trace 212. Alternatively, or additionally, the circuit trace 212 may be preformed as a wire trace, or photo-etched, or from molten material formed into a circuit pattern and subsequently adhered, embedded, or otherwise secured to the support substrate 210.

The material of the circuit trace 212 may include, but is not limited to, silver, copper, gold, carbon, conductive polymers, etc. In some instances, the circuit trace 212 may include a silver-coated copper particle. A thickness of the circuit trace 212 may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in one non-limiting example, the support substrate 210 may be a flexible, translucent polyester sheet having a desired circuit pattern screen printed thereon using a silver-based conductive ink material to form the circuit trace 212.

The support substrate conveyance mechanism 202 may include a support substrate conveyor frame 214 for securing a support substrate holder frame 216. The structure of the support substrate holder frame 216 may vary significantly depending on the type and properties (e.g., shape, size, elasticity, etc.) of the support substrate being used. Inasmuch as the support substrate 210 may be a flexible material, support substrate 210 may be held under tension in the support substrate holder frame 216, so as to create a more rigid surface upon which a transfer operation, discussed herein below, is performed. In the above example, the rigidity created by the tension in the support substrate 210 may increase the placement accuracy when transferring components.

In some instances, using a durable or more rigid material for the support substrate 210, naturally provides a firm surface for component placement accuracy. In contrast, when the support substrate 210 is allowed to sag, wrinkles and/or other discontinuities may form in the support substrate 210 and interfere with the pre-set pattern of the circuit trace 212, to the extent that the transfer operation may be unsuccessful.

While the means of holding the support substrate 210 may vary greatly, FIG. 2A illustrates an embodiment of a support substrate holder frame 216 including a first portion 216a having a concave shape and a second portion 216b having a convex counter shape that corresponds in shape to the concave shape. In the depicted example, tension is created for the support substrate 210 by inserting an outer perimeter of the support substrate 210 between the first portion 216a and the second portion 216b to thereby clamp the support substrate 210 tightly.

The support substrate conveyor frame 214 may be conveyed in at least three directions—two directions in the horizontal plane and vertically as well. The conveyance may be accomplished via a system of motors, rails, and gears (none of which are shown). As such, the support substrate tensioner frame 216 may be conveyed to and held in a specific position as directed and/or programmed and controlled by a user of the apparatus 200.

The wafer tape conveyance mechanism 204 may be implemented to secure a wafer tape 218 having die 220 (i.e., semiconductor device die) thereon. The wafer tape 218 may be conveyed in multiple directions to the specific transfer positions for the transfer operation via a wafer tape conveyor frame 222. Similar to the support substrate conveyor frame 214, the wafer tape conveyor frame 222 may include a system of motors, rails, and gears (none of which are shown).

The unpackaged semiconductor die 220 for transfer may be extremely small. Indeed, the height of the die 220 may range from 12.5 to 200 microns, or from 25 to 100 microns, or from 50 to 80 microns.

Due to the micro size of the die, when the wafer tape 218 has been conveyed to the appropriate transfer position, a gap spacing between the wafer tape 218 and the support substrate 210 may range from about 0.25 mm to 1.50 mm, or about 0.50 mm to 1.25 mm, or about 0.75 mm to 1.00 mm, for example. A minimum gap spacing may depend on factors including: a thickness of the die being transferred, a stiffness of the wafer tape involved, an amount of deflection of the wafer tape needed to provide adequate capture and release of the die, a proximity of the adjacent die, etc. As the distance between the wafer tape 218 and the support substrate 210 decreases, a speed of the transfer operation may also decrease due to the reduced cycle time (discussed further herein) of the transfer operation. Such a decrease in the duration of a transfer operation may therefore increase a rate of die transfers. For example, the die transfer rate may range from about 6-250 die placed per second.

Furthermore, the wafer tape conveyor frame 222 may secure a wafer tape holder frame 224, which may stretch and hold the wafer tape 218 under tension. As illustrated in FIG. 2A, the wafer tape 218 may be secured in the wafer tape holder frame 224 via clamping a perimeter of the wafer tape 218 between adjacent components of the wafer holder frame 224. Such clamping assists in maintaining the tension and stretched characteristic of the wafer tape 218, thereby increasing the success rate of the transfer operation. In view of the varying properties of different types/brands/qualities of wafer tapes available, a particular wafer tape may be selected for use based on an ability to consistently remain at a desired tension during a transfer process. In some instances, the needle actuation performance profile (discussed further herein below) may change depending on the tension of the wafer tape 218.

The material used for the wafer tape 218 may include a material having elastic properties, such as a rubber or silicone, for example. Furthermore, inasmuch as temperature of the environment and the wafer tape 218 itself may contribute to potential damage to the wafer tape 218 during the transfer process, a material having properties that are resistant to temperature fluctuation may be advantageous. Additionally, in some instances, the wafer tape 218 may be stretched slightly so as to create a separation or gap between individual die 220 to assist in the transfer operation. A surface of the wafer tape 218 may include a sticky substance via which the die 220 may be removably adhered to the wafer tape 218.

The die 220 on the wafer tape 218 may include die that were individually cut from a solid semiconductor wafer and then placed onto the wafer tape 218 to secure the die. In such a situation, the die may have been pre-sorted and explicitly organized on the wafer tape 218, in order, for example, to assist in the transfer operation. In particular, the die 220 may be arranged sequentially as to the expected order of transfer to the support substrate 210. Such pre-arrangement of the die 220 on the wafer tape 218 may reduce the amount of travel that would otherwise occur between the support substrate conveyance mechanism 202 and the wafer tape conveyance mechanism 204. Additionally, or alternatively, the die on the wafer tape 218 may have been pre-sorted to include only die having substantially equivalent performance properties. In this case, efficiency of the supply chain may be increased and thus, travel time of the wafer tape conveyance mechanism 204 may be reduced to a minimum.

In some instances, materials used for the die may include, but is not limited to, silicon carbide, gallium nitride, a coated silicon oxide, etc. Furthermore, sapphire or silicon may be used as a die as well. Additionally, as indicated above, a "die" may be representative herein of an electrically actuatable element generally.

In some embodiments, the wafer tape 218 may include die that are not pre-sorted, but rather are formed by simply cutting a semiconductor directly on wafer tape, and then leaving the die on the wafer tape without "picking and placing" to sort the die depending on the respective performance quality of the die. In such a situation, the die on the wafer tape may be mapped to describe the exact relative locations of the different quality die. Therefore, in some instances, it may be unnecessary to use wafer tape having pre-sorted die. In such a case, the amount of time and travel for the wafer tape conveyance mechanism 204 to move between particular die for each sequential transfer operation may increase. This may be caused in part by the varying quality of the die dispersed within the area of the semiconductor, which means that a die of a specific quality for the next transfer operation may not be immediately adjacent to the previously transferred die. Thus, the wafer tape conveyance mechanism 204 may move the wafer tape 218 further to align an appropriate die of a specific quality for transfer than would be necessary for a wafer tape 218 containing die of substantially equivalent quality.

In further regard to the die 220 on the wafer tape 218, in some instances, a data map of the die 220 may be provided with the wafer tape 218. The data map may include a digital file providing information that describes the specific quality and location of each die on the wafer tape 218. The data map file may be input into a processing system in communication with the apparatus 200, whereby the apparatus 200 may be controlled/programmed to seek the correct die 220 on the wafer tape 218 for transfer to the support substrate 210.

A transfer operation is performed, in part, via the transfer mechanism 206, which is a die separation device for assisting in separation of die from the wafer tape 218. The actuation of the transfer mechanism 206 may cause one or more die 220 to be released from the wafer tape 218 and to be captured by the support substrate 210. In some instances, the transfer mechanism 206 may operate by pressing an elongated rod, such as a pin or a needle 226 into a top surface of the wafer tape 218 against a die 220. The needle 226 may be connected to a needle actuator 228. The needle actuator 228 may include a motor connected to the needle 226 to drive the needle 226 toward the wafer tape 218 at predetermined/programmed times.

In view of the function of the needle 226, the needle 226 may include a material that is sufficiently durable to withstand repetitive, rapid, minor impacts while minimizing potential harm to the die 220 upon impact. For example, the needle 226 may include a metal, a ceramic, a plastic, etc. Additionally, a tip of the needle 226 may have a particular shape profile, which may affect the ability of the needle to function repetitively without frequently breaking either the tip or damaging the wafer tape 218 or the die 220. The profile shape of the tip of the needle is discussed in greater detail below with respect to FIG. 3.

In a transfer operation, the needle 226 may be aligned with a die 220, as depicted in FIG. 2A, and the needle actuator may move the needle 226 to push against an adjacent side of the wafer tape 218 at a position in which the die 220 is aligned on the opposing side of the wafer tape 218, as depicted in FIG. 2B. The pressure from the needle 226 may cause the wafer tape 218 to deflect so as to extend the die 220 to a position closer to the support substrate 226 than adjacent die 220, which are not being transferred. As indicated above, the amount of deflection may vary depending several factors, such as the thickness of the die and circuit trace. For example, where a die 220 is about 50 microns thick and circuit trace 212 is about 10 microns thick, an amount of deflection of the wafer tape 218 may be about 75 microns. Thus, the die 220 may be pressed via the needle 226 toward the support substrate 210 to the extent that the electrical contact terminals (not shown) of the die are able to bond with the circuit trace 212, at which point, the transfer operation proceeds to completion and the die 220 is released from the wafer tape 218.

To the extent that the transfer process may include a rapidly repeated set of steps including a cyclical actuation of the needle 226 pressing upon a die 220, a method of the process is described in detail herein below with respect to FIG. 8. Further, the stroke profile of the actuation of the needle 226 (within the context of the transfer process) is discussed in more detail hereafter with respect to FIG. 4.

Turning back to FIGS. 2A and 2B, in some instances, transfer mechanism 206 may further include a needle retraction support 230, (also known as a pepper pot). In an embodiment, the support 230 may include a structure having a hollowed space wherein the needle 226 may be accommodated by passing into the space via an opening 232 in a first end of the support 230. The support 230 may further include at least one opening 234 on a second opposing end of the support 230. Moreover, the support may include multiple perforations near opening 234. The at least one opening 234 may be sized with respect to a diameter of the needle 226 to accommodate passage of the needle 226 therethrough so as to press on the wafer tape 218 during the transfer process.

Additionally, in some instances, the support 230 may be disposed adjacent to the upper surface of the wafer tape 218. As such, when the needle 226 is retracted from pressing on the wafer tape 218 during a transfer operation, a base surface of the support 230 (having the at least one opening 234 therein) may come into contact with the upper surface of the wafer tape 218, thereby preventing upward deflection of the wafer tape 218. This upward deflection may be caused in the event where the needle 226 pierces at least partially into the wafer tape 218, and while retracting, the wafer tape is stuck to the tip of the needle 226. Thus, the support 230 may reduce the time it takes to move to the next die 220. A wall perimeter shape of the support 230 may be cylindrical or any other shape that may be accommodated in the apparatus 200. Accordingly, the support 230 may be disposed between the needle 226 and an upper surface of the wafer tape 218.

With respect to the effect of temperature on the integrity of the wafer tape 218, it is contemplated that a temperature of support 230 may be adjusted so as to regulate the temperature of the needle 226 and the wafer tape 218, at least near the point of the transfer operation. Accordingly, the temperature of the support 230 may be heated or cooled, and a material of the support 230 may be selected to maximize thermal conductivity. For example, the support 230 may be formed of aluminum, or another relatively high thermal conductivity metal or comparable material, whereby the temperature may be regulated to maintain consistent results of the transfer operations. In some instances, air may be circulated within the support 230 to assist in regulating the temperature of a local portion of the wafer tape 218.

Additionally, or alternatively, a fiber optic cable 230a may be inserted into the needle retraction support 230, and may further be against the needle 226 to assist in temperature regulation of the wafer tape 218 and/or the needle 226.

As indicated above, fixing mechanism 208 may assist in affixing the die 220 to the circuit trace 212 on a surface of the support substrate 210. FIG. 2B illustrates the apparatus 200 in a transfer stage, where the die 220 is pushed against the circuit trace 212. In an embodiment, fixing mechanism 208 may include an energy-emitting device 236 including, but not limited to: a laser, electromagnetic radiation, pressure vibration, ultrasonic welding, etc. In some instances, the use of pressure vibration for the energy-emitting device 236 may function by emitting a vibratory energy force so as to cause disruption of the molecules within the circuit trace against those of the electrical contact terminals so as to form a bond via the vibratory pressure. Furthermore, in an embodiment, the fixing mechanism 208 may be omitted entirely, and a transfer of one or more die to a circuit substrate may occur via other means, including adhesive strength or bonding potential.

In a non-limiting example, as depicted in FIG. 2B, a laser may be implemented as the energy-emitting device 236. During a transfer operation, laser 236 may be activated to emit a specific wavelength and intensity of light energy directed at the die 220 being transferred. The wavelength of the light of the laser 236 may be selected specifically based on the absorption of that wavelength of light with respect to the material of the circuit trace 212 without significantly affecting the material of the support substrate 210. For example, a laser having an operational wavelength of 808$nm$, and operating at 5 W may be readily absorbed by silver, but not by polyester. As such, the laser beam may pass through the substrate of polyester and affect the silver of a circuit trace. Alternatively, the wavelength of laser may match the absorption of the circuit trace and the material of the substrate. The focus area of the laser 236 (indicated by the dashed lines emanating vertically from the laser 236 in FIG. 2B toward the support substrate 210) may be sized according to the size of the LED, such as for example, a 300 micron wide area.

Upon actuation of a predetermined controlled pulse duration of the laser 236, the circuit trace 212 may begin to cure (and/or melt or soften) to an extent that a fusing bond may form between the material of the circuit trace 212 and the electrical contact terminals (not shown) on the die 220. This bond further assists in separating the unpackaged die 220 from the wafer tape 218, as well as simultaneously affixing the die 220 to the support substrate 210. Additionally, the laser 236 may cause some heat transfer on the wafer tape 218, thereby reducing adhesion of the die 220 to the wafer tape 218 and thus assisting in the transfer operation.

In other instances, die may be released and fixed to the support substrates in many ways, including using a laser having a predetermined wavelength or a focused light (e.g., IR, UV, broadband/multi spectral) for heating/activating circuit traces to thereby cure an epoxy or phase change bond materials, or for deactivating/releasing a die from wafer tape, or for initiating some combination of reactions. Additionally, or alternatively, a specific wavelength laser or light may be used to pass through one layer of the system and interact with another layer. Furthermore, a vacuum may be implemented to pull a die from the wafer tape, and air pressure may be implemented to push the die onto a support substrate, potentially including a rotary head between the die wafer tape and the support substrate. In yet another instance, ultrasonic vibration may be combined with pressure to cause the die to bond to the circuit traces.

Similar to the needle retraction support 230, the fixing mechanism may also include a support substrate support 238, which may be disposed between the laser 236 and the bottom surface of the support substrate 210. The support 238 may include an opening 240 at a base end thereof and an opening 242 at an upper end thereof. For example, the support 238 may be formed as a ring or hollow cylinder. The support may further include structure to secure a lens (not shown) to assist in directing the laser. The laser 236 emits the light through the openings 240, 242 to reach the support substrate 210. Furthermore, the upper end of the sidewalls of the support 238 may be disposed in direct contact with or closely adjacent to the bottom surface of the support substrate 210. Positioned as such, the support 238 may help to prevent damage from occurring to the support substrate 210 during the stroke of the needle 226 at the time of a transfer operation. In some instances, during the transfer operation, the portion of the bottom surface of the support substrate 210 that is aligned with the support 238 may contact the support 238, which thereby provides resistance against the incoming motion of the die 220 being pressed by the needle 226. Moreover, the support 238 may be movable in a direction of the vertical axis to be able to adjust a height thereof so as to raise and lower support 238 as necessary, including to a height of the support substrate 210.

In addition to the above features, apparatus 200 may further include a first sensor 244, from which apparatus 200 receives information regarding the die 220 on the wafer tape 218. In order to determine which die is to be used in the transfer operation, the wafer tape 218 may have a bar code (not shown) or other identifier, which is read or otherwise detected. The identifier may provide die map data to the apparatus 200 via the first sensor 244.

As shown in FIGS. 2A and 2B, the first sensor 244 may be positioned near the transfer mechanism 206 (or the needle 226 specifically), spaced apart from the transfer mechanism 206 by a distance d, which may range from about 1-5 inches, so as to enhance the accuracy of location detection. In an alternative embodiment, first sensor 244 may be disposed adjacent the tip of the needle 226 in order to sense the exact position of the die 220 in real time. During the transfer process, the wafer tape 218 may be punctured and or further stretched over time, which may alter the previously mapped, and thus expected, locations of the die 220 on the wafer tape 218. As such, small changes in the stretching of the wafer tape 218 could add up to significant errors in alignment of the die 220 being transferred. Thus, real time sensing may be implemented to assist in accurate die location.

In some instances, the first sensor 244 may be able to identify the precise location and type of die 220 that is being sensed. This information may be used to provide instructions to the wafer tape conveyor frame 222 indicating the exact location to which the wafer tape 218 should be conveyed in order to perform the transfer operation. Sensor 244 may be one of many types of sensors, or a combination of sensor types to better perform multiple functions. Sensor 244 may include, but is not limited to: a laser range finder, or an optical sensor, such as a non-limiting example of a high-definition optical camera having micro photography capabilities.

Moreover, in some instances, a second sensor 246 may also be included in apparatus 200. The second sensor 246 may be disposed with respect to the support substrate 210 so as to detect the precise position of the circuit trace 212 on the support substrate 210. This information may then be used to determine any positional adjustment needed to align the support substrate 210 between the transfer mechanism 206 and the fixing mechanism 208 so that the next transfer operation occurs in the correct location on the circuit trace 212. This information may further be relayed to the apparatus 200 to coordinate conveying the support substrate 210 to a correct position, while simultaneously conveying instructions to the wafer tape conveyor frame 222. A variety of sensors are also contemplated for sensor 246 including optical sensors, such as one non-limiting example of a high-definition optical camera having micro photography capabilities.

FIGS. 2A and 2B further illustrate that the first sensor 244, the second sensor 246, and the laser 236 may be grounded. In some instances, the first sensor 244, the second sensor 246, and the laser 236 may all be grounded to the same ground (G), or alternatively, to a different ground (G).

Depending on the type of sensor used for the first and second sensors 244, 246, the first or second sensors may further be able to test the functionality of transferred die. Alternatively, an additional tester sensor (not shown) may be incorporated into the structure of apparatus 200 to test individual die before removing the support substrate 210 from the apparatus 200.

Furthermore, in some examples, multiple independently-actuatable needles and/or lasers may be implemented in a machine in order to transfer and fix multiple die at a given time. The multiple needles and/or lasers may be independently movable within a three-dimensional space. Multiple die transfers may be done synchronously (multiple needles going down at the same time), or concurrently but not necessarily synchronously (e.g., one needle going down while the other is going up, which arrangement may balance better the components and minimize vibration). Control of the multiple needles and/or lasers may be coordinated to avoid collisions between the plurality of components. Moreover, in other examples, the multiple needles and/or lasers may be arranged in fixed positions relative to each other.

Example Needle Tip Profile

Figure 3:
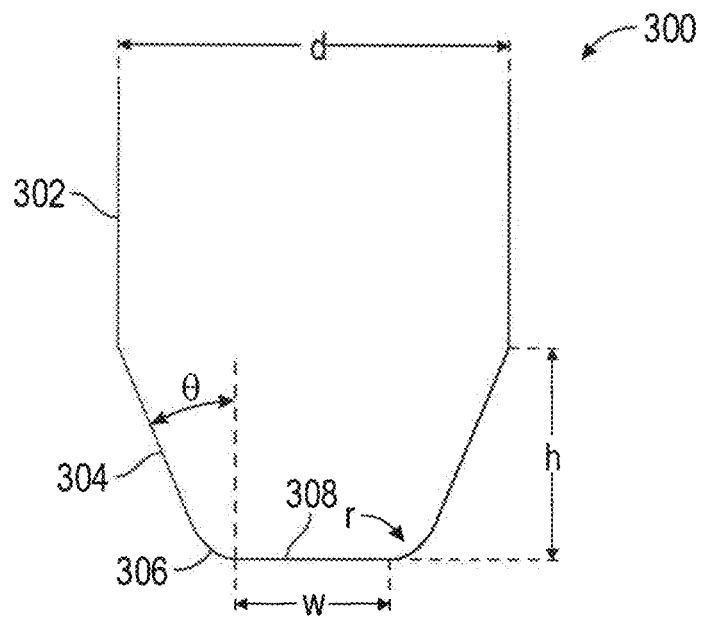
FIG. 3 illustrates an embodiment of a shape profile of the end of a needle of a transfer mechanism.

As mentioned above, a profile shape of the tip 300 of a needle is discussed with respect to FIG. 3, which shows a schematic example profile shape of the tip 300. In an embodiment, the tip 300 may be defined as the end of the needle, including sidewalls 302 adjoining tapered portion 304, corner 306, and base end 308, which may extend transversely to the opposing side of the needle. The specific size and shape of the tip 300 may vary according to factors of the transfer process such as, for example, the size of the die 220 being transferred and the speed and the impact force, of a transfer operation. For example, the angle θ seen in FIG. 3, as measured between a longitudinal direction of the central axis of the needle and the tapered portion 304 may range from about 10 to 15°; the radius r of the corner 306 may range from about 15 to 50+ microns; the width w of the base end 308 may range from about 0 to 100+ microns (μm), where w may be less than or equal to the width of the die 220 being transferred; the height h of the tapered portion 304 may range from about 1 to 2 mm, where h may be greater than a distance traveled by needle during a stroke of a transfer operation; and the diameter d of the needle 226 may be approximately 1 mm.

Other needle tip profiles are contemplated and may have different advantages depending on various factors associated with the transfer operation. For example, the needle tip 300 may be more blunt to mirror the width of the die or more pointed so as to press in a smaller area of the wafer tape. In some instances, the transfer mechanism 206 may implement two or more needles. In such an instance, the two or more needles may have a substantially similar needle profile or they may have substantially different needle profiles. For example, the transfer mechanism 206 may include one or more needles 226 that have a needle tip profile as described and depicted with regard to FIG. 3. The transfer mechanism may further include one or more needles 226 that have a substantially different needle tip profile (i.e., wider than the depicted and described needle tip profile or narrower than the depicted and described needle tip profile). In some instances, the needle profile may not include any tapering to a point such that the needle 226 includes a constant width along an entire length of the needle 226.

Example Needle Actuation Performance Profile

Figure 4:
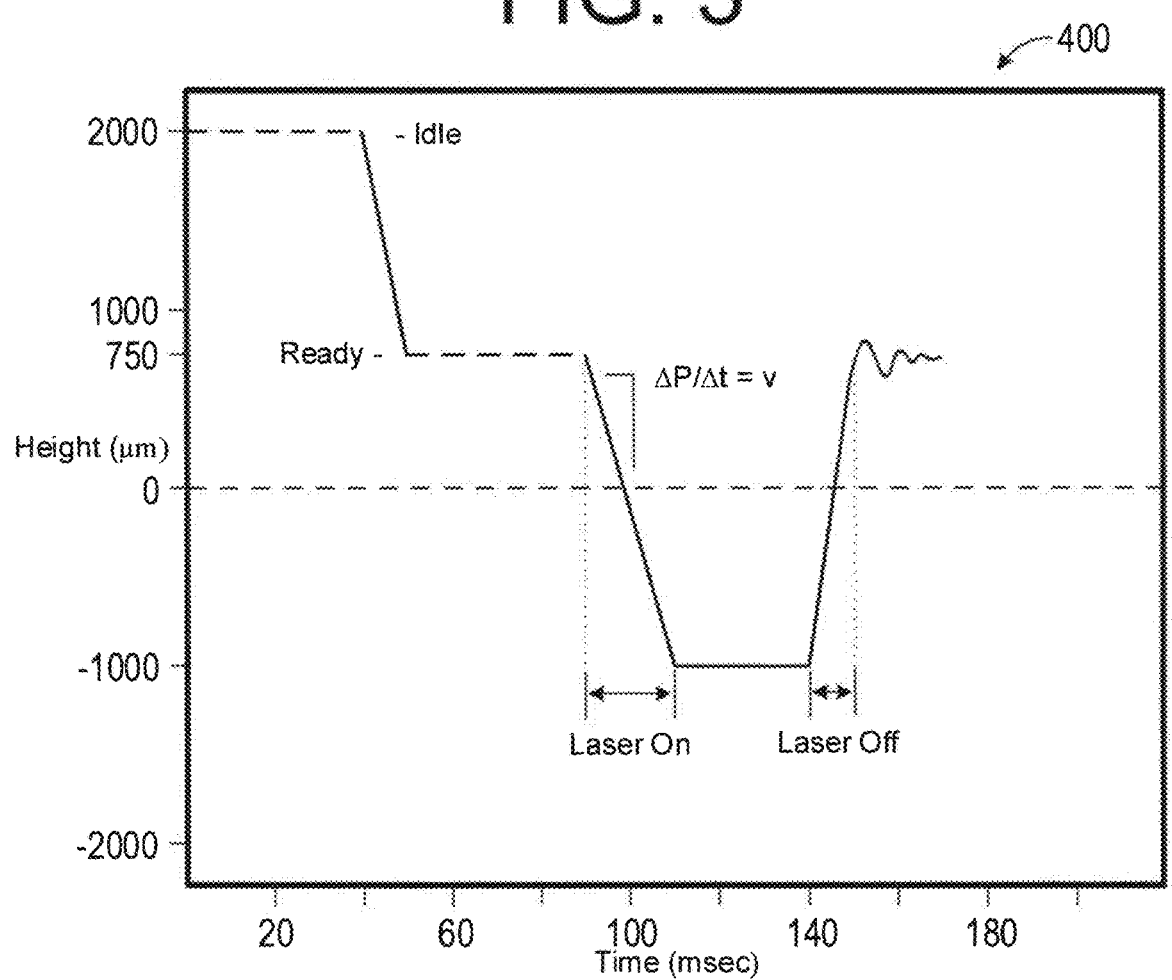
FIG. 4 illustrates an embodiment of a needle actuation stroke profile.

Illustrated in FIG. 4 is an embodiment of a needle actuation performance profile. That is, FIG. 4 depicts an example of the stroke pattern performed during a transfer operation by displaying the height of the needle tip with respect to the plane of the wafer tape 218 as it varies with time. As such, the "0" position in FIG. 4 may be the upper surface of the wafer tape 218. Further, inasmuch as the idle time of the needle and the ready time of the needle may vary depending on the programmed process or the varying duration of time between transferring a first die and the time it takes to reach a second die for transfer, the dashed lines shown at the idle and ready phases of the stroke pattern indicate that the time is approximate, but may be longer or shorter in duration. Moreover, it is to be understood that the solid lines shown for use of the laser are example times for an embodiment illustrated herewith, however, the actual duration of laser on and off time may vary depending on the materials used in forming the circuit (such as the material choice of the circuit trace), the type of support substrate, the desired effect (pre-melting circuit trace, partial bond, complete bond, etc.), the distance of the laser from the bond point (i.e., the upper surface of the support substrate), the size of the die being transferred, and the power/intensity/wavelength of the laser, etc. Accordingly, the following description of the profile shown in FIG. 4 may be an example embodiment of a needle profile.

In some instances, prior to a transfer operation, a fully retracted needle tip may be idle at approximately 2000 μm above the surface of the wafer tape. After a varying amount of time, the needle tip may descend rapidly to rest in the ready state at approximately 750 μm above the surface of the wafer tape. After another undetermined amount of time at the ready state, the needle tip may descend again to contact the die and press the wafer tape with the die down to a height of approximately −1000 μm, where at the die may be transferred to the support substrate. The dotted vertical line at the start of the laser on section indicates that the laser may come on at some point between the beginning of the descent from the ready phase and the bottom of the stroke of the needle tip. For example, the laser may turn on at approximately 50% of the way through the descent. In some instances, by turning the laser on early, for example before the needle begins to descend, the circuit trace may begin to soften prior to contact with the die so as to form a stronger bond, or additionally, the die wafer may be affected or prepared during this time. The phase in which the laser turns on may last approximately 20 ms ("milliseconds"). At the bottom of the stroke, where the laser is on, that phase may be a bonding phase between the die and the support substrate. This bonding phase may allow the circuit trace to attach to the die contacts, which stiffens quickly after the laser is turned off. As such, the die may be bonded to the support substrate. The bonding phase may last approximately 30 ms. Thereafter, the laser may be turned off and the needle may ascend to the ready phase rapidly. Conversely, the laser may be turned off before the needle begins to ascend, or at some point during the ascent of the needle tip back to the ready phase, the laser may be turned off After the ascent of the needle tip to the ready phase, the height of the needle tip may overshoot and bounce back under the height of the ready phase somewhat buoyantly. While some of the buoyancy may be attributed to the speed at which the needle tip ascends to the ready phase, the speed and the buoyancy may be intentional in order to assist in retracting a tip of the needle from a surface of the wafer tape in the case where the needle has pierced the wafer tape and may be stuck therein.

As depicted in FIG. 4, the timing in which the laser is turned off may be longer than the timing in which the laser is turned on, where a slower speed of the descent may assist in preventing damage to the die, and as mentioned above, the rapid rate of ascent may assist in extracting the needle tip from the wafer tape more effectively. Nevertheless, as previously stated, the timing shown on FIG. 4 is approximate, particularly with respect to the idle and ready periods. Therefore, the numerical values assigned along the bottom edge of the FIG. 4 are for reference and should not be taken literally, except when otherwise stated.

Example Support substrate

Figure 5:
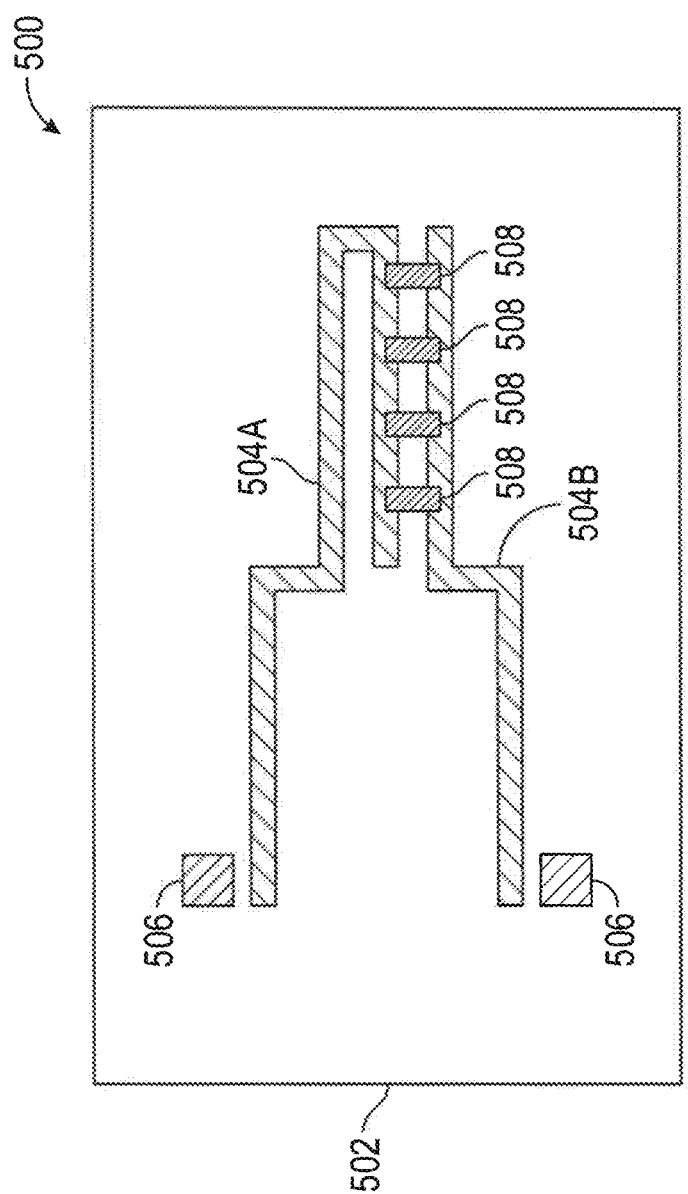
FIG. 5 illustrates a plan view of an embodiment of a support substrate having a circuit trace thereon.

FIG. 5 illustrates an example embodiment of a processed support substrate 500. A support substrate 502 may include a first portion of a circuit trace 504A, which may perform as a negative or positive power terminal when power is applied thereto. A second portion of the circuit trace 504B may extend adjacent to the first portion of the circuit trace 504A, and may act as a corresponding positive or negative power terminal when power is applied thereto.

As similarly described above with respect to the wafer tape, in order to determine where to convey the support substrate 502 to perform the transfer operation, the support substrate 502 may have a bar code (not shown) or other identifier, which is read or otherwise detected. The identifier may provide circuit trace data to the apparatus. The support substrate 502 may further include datum points 506. Datum points 506 may be visual indicators for sensing by the support substrate sensor (for example, second sensor 246 in FIG. 2) to locate the first and second portions of the circuit trace 504A, 504B. Once the datum points 506 are sensed, a shape and relative position of the first and second portions of the circuit trace 504A, 504B with respect to the datum points 506 may be determined based on preprogrammed information. Using the sensed information in connection with the preprogrammed information, the support substrate conveyance mechanism may convey the support substrate 502 to the proper alignment position for the transfer operation.

Additionally, die 508 are depicted in FIG. 5 as straddling between the first and second portions of the circuit trace 504A, 504B. In this manner, the electrical contact terminals (not shown) of the die 508 may be bonded to the support substrate 502 during a transfer operation. Accordingly, power may be applied to run between the first and second portions of the circuit trace 504A, 504B, and thereby powering die 508. For example, the die may be unpackaged LEDs that were directly transferred from a wafer tape to the circuit trace on the support substrate 502. Thereafter, the support substrate 502 may be processed for completion of the support substrate 502 and used in a circuit or other final product. Further, other components of a circuit may be added by the same or other means of transfer to create a complete circuit, and may include control logic to control LEDs as one or more groups in some static or programmable or adaptable fashion.

Simplified Example Direct Transfer System

Figure 6:
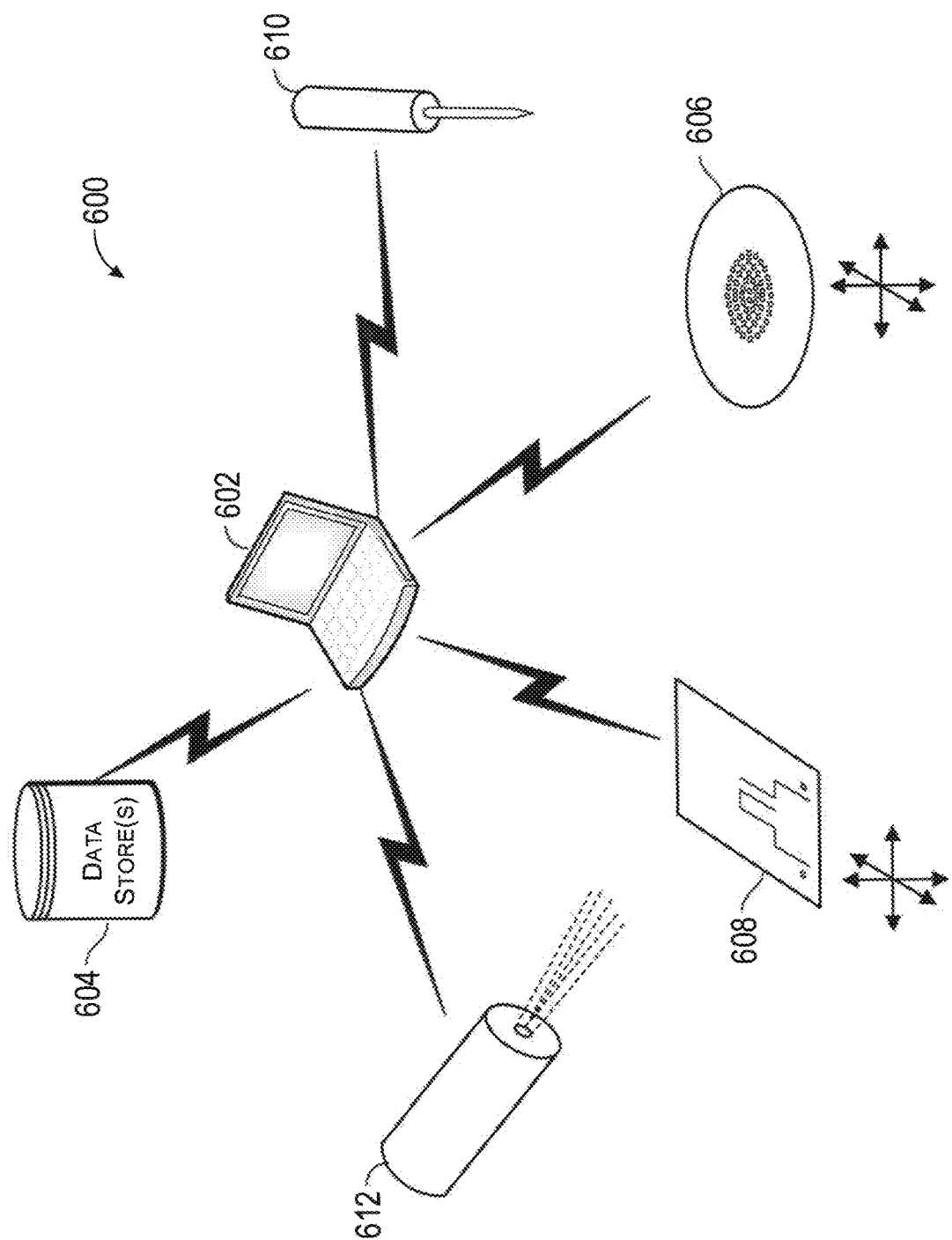
FIG. 6 illustrates a schematic view of an embodiment of elements of a die transfer system.

A simplified example of an embodiment of a direct transfer system 600 is illustrated in FIG. 6. The transfer system 600 may include a personal computer (PC) 602 (or server, data input device, user interface, etc.), a data store 604, a wafer tape mechanism 606, a support substrate mechanism 608, a transfer mechanism 610, and a fixing mechanism 612. Inasmuch as a more detailed description of the wafer tape mechanism 606, the support substrate mechanism 608, the transfer mechanism 610, and the fixing mechanism 612 has been given heretofore, specific details about these mechanisms is not repeated here. However, a brief description of how the wafer tape mechanism 606, the support substrate mechanism 608, the transfer mechanism 610, and the fixing mechanism 612 relate to interactions between the PC 602 and the data store 604 is described hereafter.

In some instances, the PC 602 communicates with data store 604 to receive information and data useful in the transfer process of directly transferring die from a wafer tape in wafer tape mechanism 606 using the transfer mechanism 610 on to a support substrate in the support substrate mechanism 608 whereat the die may be fixed upon the support substrate via actuation of a laser or other energy-emitting device located in the fixing mechanism 612. PC 602 may also serve as a receiver, compiler, organizer, and controller of data being relayed to and from each of the wafer tape mechanism 606, the support substrate mechanism 608, the transfer mechanism 610, and the fixing mechanism 612. PC 602 may further receive directed information from a user of the transfer system 600.

Note that, while FIG. 6 depicts directional movement capability arrows adjacent to the wafer tape mechanism 606 and the support substrate mechanism 608, those arrows merely indicate general directions for mobility, however, it is contemplated that both the wafer tape mechanism 606 and the support substrate mechanism 608 may also be able to move in other directions including rotation in plane, pitch, roll, and yaw, for example.

Figure 7:
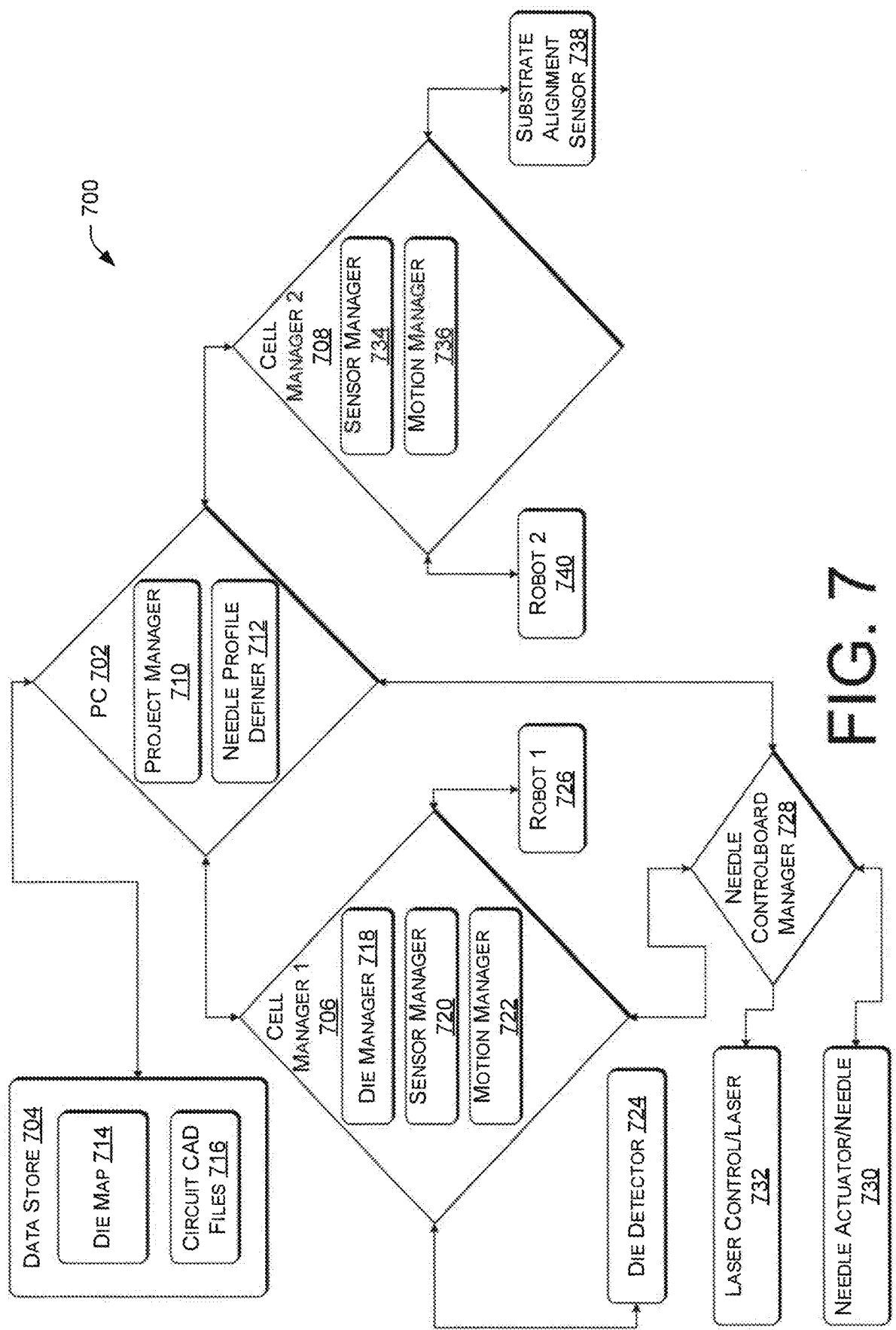
FIG. 7 illustrates a schematic view of an embodiment of a circuitry path between machine hardware and controllers of a die transfer system.

Additional details of the interaction of the components of the transfer system 600 are described with respect to FIG. 7 below.

Detailed Example Direct Transfer System

A schematic of the communication pathways between the respective elements of a transfer system 700 may be described as follows.

The direct transfer system may include a personal computer (PC) 702 (or server, data input device, user interface, etc.), which may receive communication from, and provide communication to a data store 704. The PC 702 may further communicate with a first cell manager 706 (illustrated as "Cell Manager 1") and a second cell manager 708 (illustrated as "Cell Manager 2"). Therefore, the PC 702 may control and synchronize the instructions between the first cell manager 706 and the second cell manager 708.

PC 702 may include processors and memory components with which instructions may be executed to perform various functions with respect to the first and second cell managers 706, 708, as well as data store 704. In some instances, PC 702 may include a project manager 710 and a needle profile definer 712.

Project manager 710 may receive input from the first and second cell managers 706, 708 and data store 704 to organize the direct transfer process and maintain smooth functioning with respect to orientation and alignment of the support substrate with respect to the wafer tape and the die thereon.

Needle profile definer 712 may contain data regarding the needle stroke performance profile, which may be used to instruct the transfer mechanism regarding the desired needle stroke performance according to the specific die on the loaded wafer tape and the pattern of the circuit trace on the support substrate. Additional details of the needle profile definer 712 are discussed further herein below.

Turning back to data store 704, data store 704 may include memory containing data such as a die map 714, which may be specific to the wafer tape loaded in the wafer tape mechanism. As explained previously, a die map may describe the relative locations of each die on the wafer tape and the quality thereof for the purpose of providing a pre-organized description of the location of specific die. Further, data store 704 may also include memory containing circuit CAD files 716. Circuit CAD files 716 may contain data regarding a specific circuit trace pattern on the loaded support substrate.

Project manager 710 may receive the die map 714 and circuit CAD files 716 from the data store 704, and may relay the respective information to the first and second cell managers 706, 708, respectively.

In an embodiment, the first cell manager 706 may use the die map 714 from data store 704 via a die manager 718. More specifically, die manager 718 may compare die map 714 with the information received by a sensor manager 720, and based thereon, may provide instructions to a motion manager 722 regarding the location of a particular die. Sensor manager 720 may receive data regarding the actual location of die on the wafer tape from a die detector 724. Sensor manager 720 may also instruct the die detector 724 to look for a particular die in a particular location according to die map 714. The die detector 724 may include a sensor such as the second sensor 244 in FIGS. 2A and 2B. Based on the received data of the actual location (either a confirmation or an update regarding a shift in position) of the die on the wafer tape, the motion manager 722 may instruct a first robot 726 (illustrated as "Robot 1") to convey the wafer tape to an alignment position with the needle of the transfer mechanism.

Upon reaching the instructed location, the first robot 726 may communicate the completion of its movement to a needle controlboard manager 728. Additionally, the needle control board manager 728 may directly communicate with the PC 702 to coordinate the execution of the transfer operation. At the time of the execution of the transfer operation, the PC 702 may instruct the needle control board manager 728 to activate the needle actuator/needle 730, thereby causing the needle to perform a stroke in accordance with the loaded needle profile in the needle profile definer 712. The needle controlboard manager 728 may also activate the laser control/laser 732, thereby causing the laser to emit a beam toward the support substrate as the needle presses down a die via the wafer tape to execute the transfer operation. As indicated above, the activation of the laser control/laser 732 may occur prior to, simultaneously, during, or after activation, or even a complete actuation, of the needle stroke.

Accordingly, the first cell manager 706 may pass through a plurality of states including: determining where to tell the first robot 726 to go; telling the first robot 726 to go to the determined location; turning on the needle; activating the fixing device; and resetting.

Prior to execution of the transfer operation, the project manager 710 may relay the data of the circuit CAD files 716 to the second cell manager 708. The second cell manager 708 may include a sensor manager 734 and a motion manager 736. Using the circuit CAD files 716, the sensor manager 734 may instruct the substrate alignment sensor 738 to find the datum points on the support substrate and thereby detect and orient the support substrate according to the location of the circuit trace thereon. The sensor manager 734 may receive confirmation or updated location information of the circuit trace pattern on the support substrate. The sensor manager 734 may coordinate with the motion manager 736 to provide instructions to a second robot 740 (illustrated as "Robot 2") to convey the support substrate to an alignment position (i.e., a transfer fixing position) for execution of the transfer operation. Thus, the circuit CAD files 716 may assist the project manager 710 in aligning the support substrate with respect to the wafer tape such that the die may be accurately transferred to the circuit trace thereon.

Accordingly, the second cell manager 708 may pass through a plurality of states including: determining where to tell the second robot 740 to go; telling the second robot 740 to go to the determined location; and resetting.

It is understood that additional and alternative communication pathways between all or fewer than all of the various components of the direct transfer system 700 described above are possible.

Example Direct Transfer Method

Figure 8:
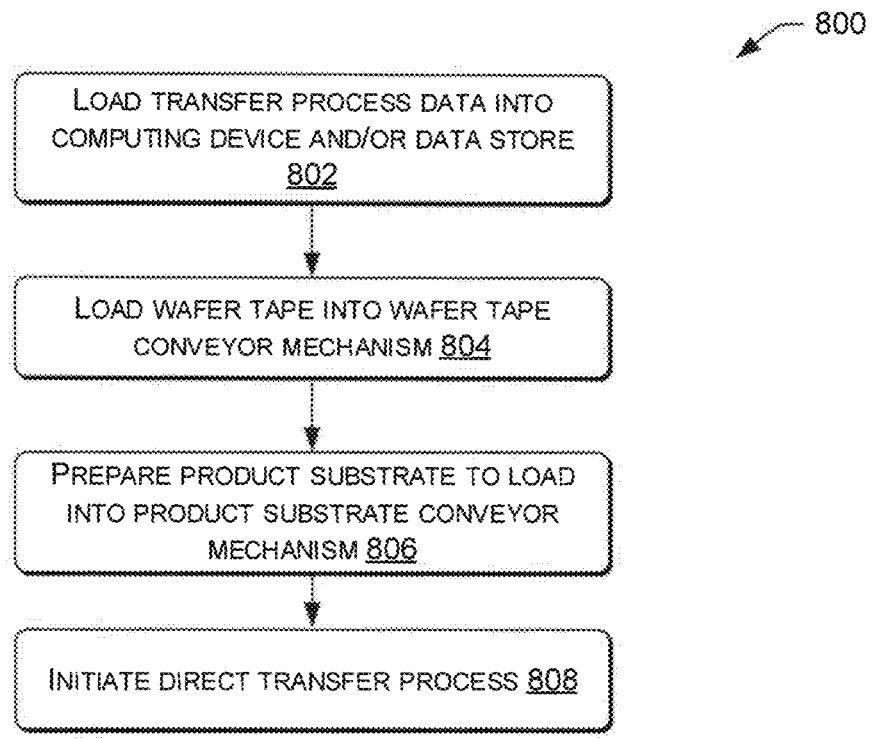
FIG. 8 illustrates a method of a die transfer process according to an embodiment of this application.

A method 800 of executing a direct transfer process, in which one or more die is directly transferred from a wafer tape to a support substrate, is illustrated in FIG. 8. The steps of the method 800 described herein may not be in any particular order and as such may be executed in any satisfactory order to achieve a desired product state. The method 800 may include a step of loading transfer process data into a PC and/or a data store 802. The transfer process data may include data such as die map data, circuit CAD files data, and needle profile data.

A step of loading a wafer tape into a wafer tape conveyor mechanism 804 may also be included in method 800. Loading the wafer tape into the wafer tape conveyor mechanism may include controlling the wafer tape conveyor mechanism to move to a load position, which is also known as an extract position. The wafer tape may be secured in the wafer tape conveyor mechanism in the load position. The wafer tape may be loaded so that the die of the semiconductor are facing downward toward the support substrate conveyor mechanism.

The method 800 may further include a step of preparing the support substrate to load into the support substrate conveyor mechanism 806. Preparing the support substrate may include a step of screen printing a circuit trace on the support substrate according to the pattern of the CAD files being loaded into the PC or data store. Additionally, datum points may be printed onto the circuit substrate in order to assist in the transfer process. The support substrate conveyor mechanism may be controlled to move to a load position, which is also known as an extraction position, whereat the support substrate may be loaded into the support substrate conveyor mechanism. The support substrate may be loaded so that the circuit trace faces toward the die on the wafer. In some instances, for example, the support substrate may be delivered and placed in the load position by a conveyor (not shown) or other automated mechanism, such as in the style of an assembly line. Alternatively, the support substrate may be manually loaded by an operator.

Once the support substrate is properly loaded into the support substrate conveyor mechanism in the wafer tape is properly loaded into the wafer tape conveyor mechanism, a program to control the direct transfer of the die from the wafer tape to the circuit trace of the support substrate may be executed via the PC to commence the direct transfer operation 808. The details of the direct transfer operation are described below.

Example Direct Transfer Operation Method

Figure 9:
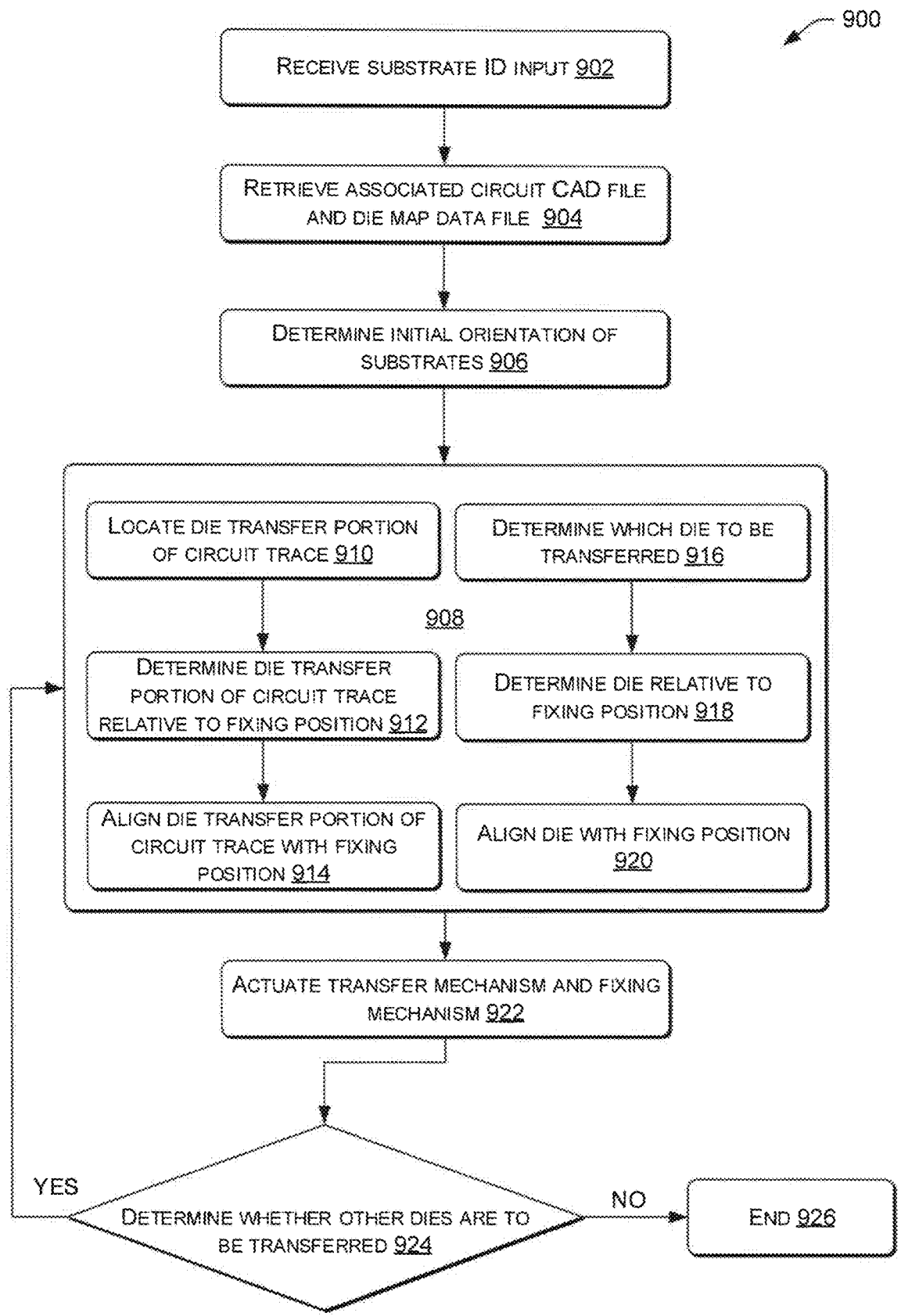
FIG. 9 illustrates a method of a die transfer operation according to an embodiment of this application.

A method 900 of the direct transfer operation of causing die to be transferred directly from the wafer tape (or other substrate holding die, also called a "die substrate" for simplified description of FIG. 9) to the support substrate is illustrated in FIG. 9. The steps of the method 900 described herein may not be in any particular order and as such may be executed in any satisfactory order to achieve a desired product state.

In order to determine which die to place on the support substrate and where to place the die on the support substrate, the PC may receive input regarding the identification of the support substrate and the identification of the die substrate containing the die to be transferred 902. This input may be entered manually by a user, or the PC may send a request to the cell managers in control, respectively, of the support substrate alignment sensor and the die detector. The request may instruct the sensor to scan the loaded substrate for an identification marker, such as a barcode or QR code; and/or the request may instruct the detector to scan the loaded die substrate for an identification marker, such as a barcode or QR code.

Using the support substrate identification input, the PC may query the data store or other memory to match the respective identification markers of the support substrate and the die substrate and retrieve the associated data files 904. In particular, the PC may retrieve a circuit CAD file associated with the support substrate that describes the pattern of the circuit trace on the support substrate. The circuit CAD file may further contain data such as the number of, relative positions of, and respective quality requirement of, the die to be transferred to the circuit trace. Likewise, the PC may retrieve a die map data file associated with the die substrate that provides a map of the relative locations of the specific die on the die substrate.

In the process of executing a transfer of a die to the support substrate, the PC may determine the initial orientation of the support substrate and the die substrate relative to the transfer mechanism and the fixing mechanism 906. Within step 906, the PC may instruct the substrate alignment sensor to locate datum points on the support substrate. As discussed above, the datum points may be used as reference markers for determining the relative location and orientation of the circuit trace on the support substrate. Further, the PC may instruct the die detector to locate one or more reference points on the die substrate to determine the outlay of the die.

Once the initial orientation of the support substrate and die substrate are determined, the PC may instruct the respective support substrate and die substrate conveyance mechanisms to orient the support substrate and die substrate, respectively, into a position of alignment with the transfer mechanism and the fixing mechanism 908.

The alignment step 908 may include determining the location of the portion of the circuit trace to which a die is to be transferred 910, and where the portion is located relative to the transfer fixing position 912. The transfer fixing position may be considered to be the point of alignment between the transfer mechanism and the fixing mechanism. Based on the data determined in steps 910 and 912, the PC may instruct the support substrate conveyance mechanism to convey the support substrate so as to align the portion of the circuit trace to which a die is to be transferred with the transfer fixing position 914.

The alignment step 908 may further include determining which die on the die substrate will be transferred 916, and where the die is located relative to the transfer fixing position 918. Based on the data determined in steps 916 and 918, the PC may instruct the wafer tape conveyance mechanism to convey the die substrate so as to align the die to be transferred with the transfer fixing position 920.

Once the die to be transferred from the die substrate and the portion of the circuit trace to which a die is to be transferred are aligned with the transfer mechanism and the fixing mechanism, the needle and the fixing device (e.g., laser) may be actuated 922 to effectuate the transfer of the die from the die substrate to the support substrate.

After a die is transferred, the PC may determine whether additional die are to be transferred 924. In the case where another die is to be transferred, the PC may revert to step 908 and realign the product and die substrates accordingly for a subsequent transfer operation. In the case where there will not be another die transferred, the transfer process is ended 926.

Example Direct Transfer Conveyor/Assembly Line System

In an embodiment described with respect to FIG. 10, several of the components of the direct transfer apparatus described above may be implemented in a conveyor/assembly line system 1000 (hereinafter "conveyor system"). In particular, FIGS. 2A and 2B depict the support substrate 210 being held by the support substrate conveyor frame 214 and tensioned by the support substrate tensioner frame 216. As an alternative to securing a support substrate conveyor frame 214 in a confined area via a system of motors, rails, and gear as indicated with respect to apparatus 200, FIG. 10 illustrates the support substrate conveyor frame 214 being conveyed through the conveyor system 1000 in which the support substrate goes through an assembly line style process. As the actual means of conveyance between operations being performed on the support substrate being conveyed, the conveyor system 1000 may include a series of tracks, rollers, and belts 1002 and/or other handling devices to sequentially convey a plurality of support substrate conveyor frames 214, each holding a support substrate.

In some instances, operation stations of the conveyor system 1000 may include one or more printing stations 1004. As blank support substrates are conveyed to the printing station(s) 1004, a circuit trace may be printed thereon. In the case that there are multiple printing stations 1004, the multiple printing stations 1004 may be arranged serially, and may be configured to perform one or more printing operations each so as to form a complete circuit trace.

Additionally, in the conveyor system 1000, the support substrate conveyor frame 214 may be conveyed to one or more die transfer stations 1006. In the event that there are multiple die transfer stations 1006, the multiple die transfer stations 1006 may be arranged serially, and may be configured to perform one or more die transfers each. At the transfer station(s), the support substrates may have one or more die transferred and affixed thereto via a transfer operation using one or more of the direct transfer apparatus embodiments described herein. For example, each transfer station 1006 may include a wafer tape conveyance mechanism, a transfer mechanism, and a fixing mechanism. In some instances, a circuit trace may have been previously prepared on the support substrate, and as such, the support substrate may be conveyed directly to the one or more transfer stations 1006.

In the transfer stations 1006, the wafer tape conveyance mechanism, the transfer mechanism, and the fixing mechanism may be aligned with respect to the conveyed support substrate conveyor frame 214 upon entering the station. In this situation, the transfer station 1006 components may repeatedly perform the same transfer operation in the same relative position on each support substrate as the plurality of support substrates are conveyed through the conveyor system 1000.

Moreover, the conveyor system 1000 may further include one or more finishing stations 1008 to which the support substrate may be conveyed to have final processing performed. The type, amount, and duration of the final processing may depend on the features of the product and the properties of the materials used to make the product. For example, the support substrate may receive additional curing time, a protective coating, additional components, etc., at the finishing station(s) 1008.

Second Example Embodiment of a Direct Transfer Apparatus

In another embodiment of a direct transfer apparatus, as seen in FIGS. 11A and 11B, a "light string" may be formed. While many of the features of apparatus 1100 may remain substantially similar to those of apparatus 200 of FIGS. 2A and 2B, support substrate conveyance mechanism 1102, as depicted in FIGS. 11A and 11B, may be configured to convey a support substrate 1104 that is different than the support substrate 212. Specifically, in FIGS. 2A and 2B, the support substrate conveyance mechanism 202 includes the conveyor frame 214 and the tensioner frame 216, which secure the sheet-like support substrate 212 under tension. In the embodiment of FIGS. 11A and 11B, however, the support substrate conveyance mechanism 1102 may include a support substrate reel system.

The support substrate reel system may include one or two circuit trace reels 1106 that are wound with a "string circuit," which may include a pair of adjacently wound conductive strings or wires as the support substrate 1104. In an instance with only one reel, the reel 1106 may be located on a first side of the transfer position, and the pair of conductive strings (1104) may be wound around the single reel 1106. Alternatively, there may be two circuit trace reels 1106 located on the first side of the transfer position, where each reel 1106 contains a single strand of the string circuit and the strands are then brought together to pass through the transfer position.

Regardless of whether one reel 1106 or two reels 1106 are implemented, the die transfer process of forming the string circuit may be substantially similar in each case. In particular, the conductive strings of the support substrate 1104 may be threaded from the reel(s) 1106 across the transfer position and may be fed into a finishing device 1108. In some instances, the finishing device 1108 may be: a coating device to receive a protective coating, for example, of a translucent or transparent plastic; or a curing apparatus, which may finish curing the string circuit as a part of final processing of the product. Additionally, or alternatively, the circuit string may be fed onto another reel, which may wind up the string circuit thereon before final processing of the string circuit. As the conductive strings of the support substrate 1104 are pulled through the transfer position, the transfer mechanism 206 may be actuated to perform a needle stroke (as described above) to transfer die 220 to the conductive strings of the support substrate 1104 so that electrical contact terminals of the die 220 are placed, respectively, on the adjacent strings, and the fixing mechanism 208 may be actuated to affix the die 220 in position.

Furthermore, apparatus 1100 may include tensioning rollers 1110 on which the conductive strings of the support substrate 1104 may be supported and further tensioned against. Thus, the tensioning rollers 1110 may assist in maintaining tension in the formed string circuit so as to enhance the die transfer accuracy.

In FIG. 11B, die 220 are depicted as having been transferred to the conductive strings of the support substrate 1104, thereby uniting (to some extent) the conductive strings of the support substrate 1104 and forming a string circuit.

Third Example Embodiment of a Direct Transfer Apparatus

Figure 12:
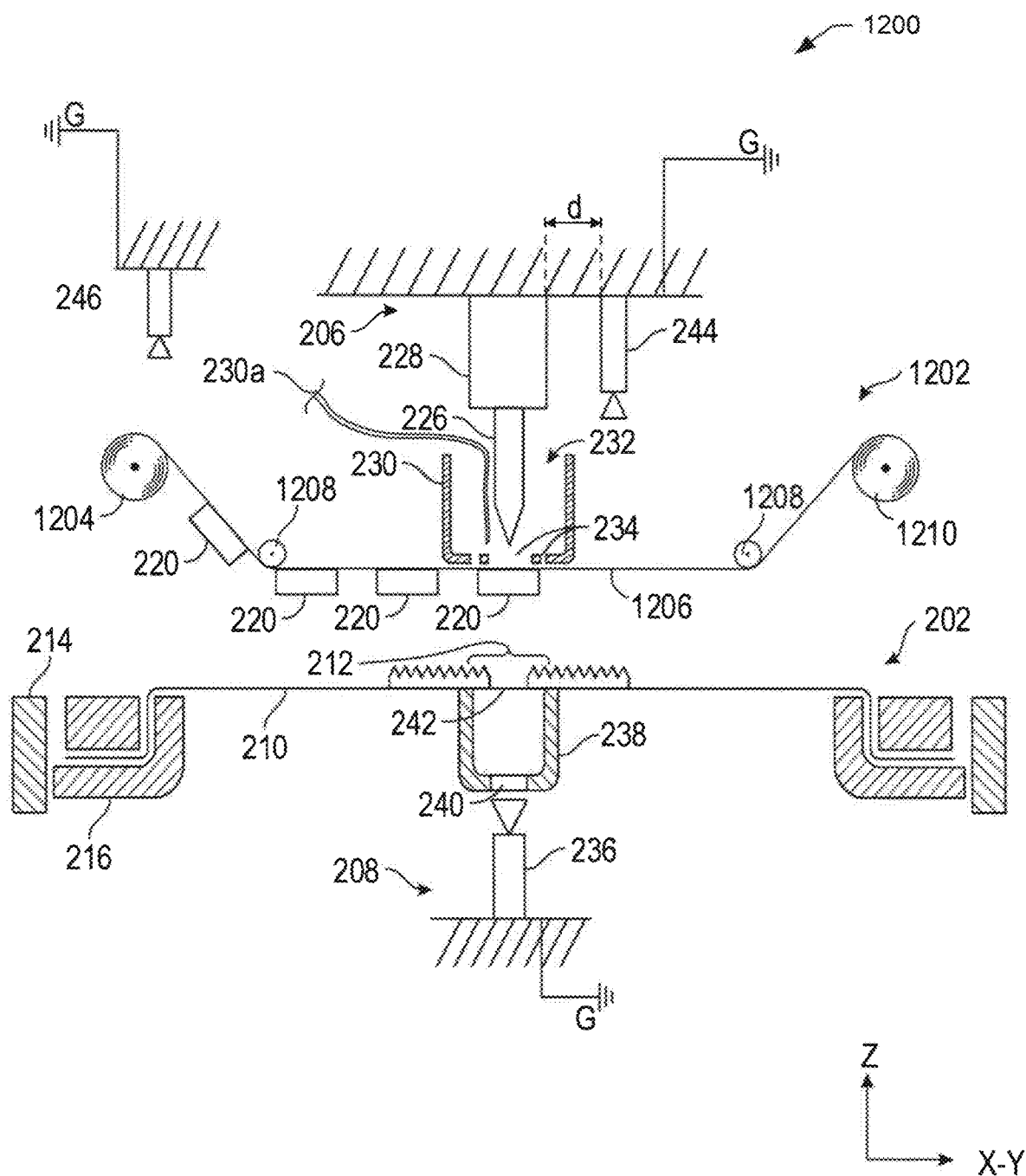
FIG. 12 illustrates a schematic view of another embodiment of a transfer apparatus in a pre-transfer position.

In an additional embodiment of a direct transfer apparatus, as seen in FIG. 12, apparatus 1200 may include a wafer tape conveyance mechanism 1202. In particular, in lieu of the wafer tape conveyor frame 222 and the tensioner frame 224 shown in FIGS. 2A and 2B, the wafer tape conveyance mechanism 1202 may include a system of one or more reels 1204 to convey die 220 through the transfer position of the apparatus 1200 to transfer die to a single substrate. In particular, each reel 1204 may include a substrate 1206 formed as a narrow, continuous, elongated strip having die 220 attached consecutively along the length of the strip.

In the case where a single reel 1204 is used, a transfer operation may include conveying the support substrate 210 via the support substrate conveyance mechanism 202 substantially as described above, using motors, tracks, and gears. However, the wafer tape conveyance mechanism 1202 may include a substantially static mechanism, in that, while the die 220 may be fed continuously through the transfer position by unrolling the substrate 1206 from reel 1204, the reel 1204 itself main remain in a fixed position. In some instances, the tension of the substrate 1206 may be maintained for stability purposes by tensioning rollers 1208, and/or a tensioning reel 1210, which may be disposed on a side of the apparatus 1200 opposite the reel 1204. The tensioning reel 1210 may roll up the substrate 1206 after the die have been transferred. Alternatively, the tension may be maintained by any other suitable means to secure the substrate 1206 so as to assist in pulling it through the transfer position after each transfer operation to cycle through the die 220.

In an embodiment where multiple reels 1204 are used, each reel 1204 may be disposed laterally adjacent to other reels 1204. Each reel 1204 may be paired with a specific transfer mechanism 206 and a specific fixing mechanism 208. In this case, each respective set of transfer mechanisms and fixing mechanisms may be arranged with respect to the support substrate 210 such that multiple die may be placed in multiple locations on the same support substrate 210 simultaneously. For example, in some instances, the respective transfer positions (i.e., the alignment between a transfer mechanism and a corresponding fixing mechanism) may be in a line, offset, or staggered so as to accommodate various circuit trace patterns.

Regardless of whether one reel 1204 or a plurality of reels 1204 are implemented, the die transfer operation may be relatively similar to the transfer operation as described above with respect to the first example embodiment of the direct transfer apparatus 200. For instance, the support substrate 210 may be conveyed to a transfer position (die fixing position) in the same manner as described above via the support substrate conveyance mechanism 202, the transfer mechanism(s) 206 may perform a needle stroke to transfer the die 220 from the die substrate 1206 to the support substrate 210, and the fixing mechanism 208 may be actuated to assist in affixing the die 220 to the support substrate 210.

Note that in an embodiment with a plurality of reels 1204, a circuit trace pattern may be such that not every transfer mechanism may need to be actuated simultaneously. Accordingly, multiple transfer mechanisms may be actuated intermittently as the support substrate is conveyed to various positions for transfer.

Fourth Example Embodiment of a Direct Transfer Apparatus

Figure 13:
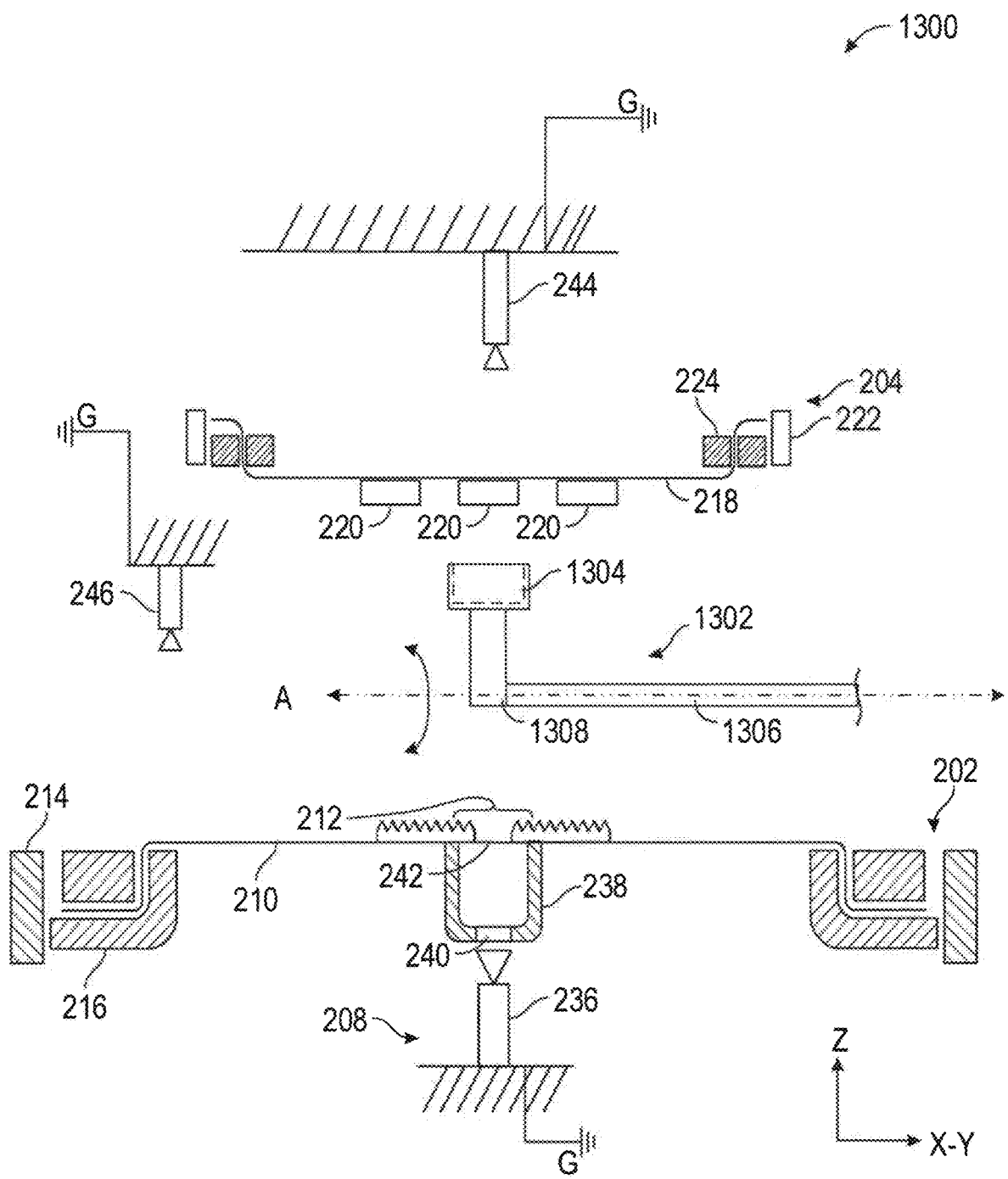
FIG. 13 illustrates a schematic view of another embodiment of a transfer apparatus in a pre-transfer position.

FIG. 13 depicts an embodiment of a direct transfer apparatus 1300. As in FIGS. 2A and 2B, the support substrate conveyance mechanism 202 may be disposed adjacent to the wafer tape conveyance mechanism 204. However, there is a space between the conveyance mechanisms 202, 204 in which a transfer mechanism 1302 may be disposed to effectuate the transfer of the die 220 from the wafer tape 218 to the support substrate 210.

The transfer mechanism 1302 may include a collet 1304 that picks the die 220, one or more at a time, from the wafer tape 218 and rotates about an axis A that extends through arm 1306. For example, FIG. 13 depicts the wafer tape 218 facing the support substrate 210 such that the collet 1304 may pivot 180 degrees about pivot point 1308 (see directional pivot arrows) between the die-carrying surface of the wafer tape 218 and the transfer surface of the support substrate 210. That is, the direction of extension of the collet 1304 pivots in a plane that is orthogonal to the surface or plane of transfer of both the wafer tape 218 and the support substrate 210. Alternatively, in some embodiments, the arm structure of the collet may be arranged to pivot between two parallel surfaces, and the arm of the collet may pivot along parallel plane. Thus, when facing the wafer tape 218, the collet 1304 may pick the die 220 and then immediately pivot to the surface of the support substrate 210 to be in line with the fixing mechanism 208. The collet 1304 then releases the die 220 so as to transfer the die 220 to be affixed to the circuit trace 212 on the support substrate 210.

In some instances, the transfer mechanism 1302 may include two or more collets (not shown) extending from the arm in different directions. In such an embodiment, the collets may be indexed rotatingly 360 degrees through the collet stop locations and picking and transferring a die every time a collet passes the wafer tape 218.

Additionally, the one or more collets 1304 may pick and release the die 220 from the wafer tape using positive and negative vacuum pressure through the collet 1304.

Fifth Example Embodiment of a Direct Transfer Apparatus

Figure 14:
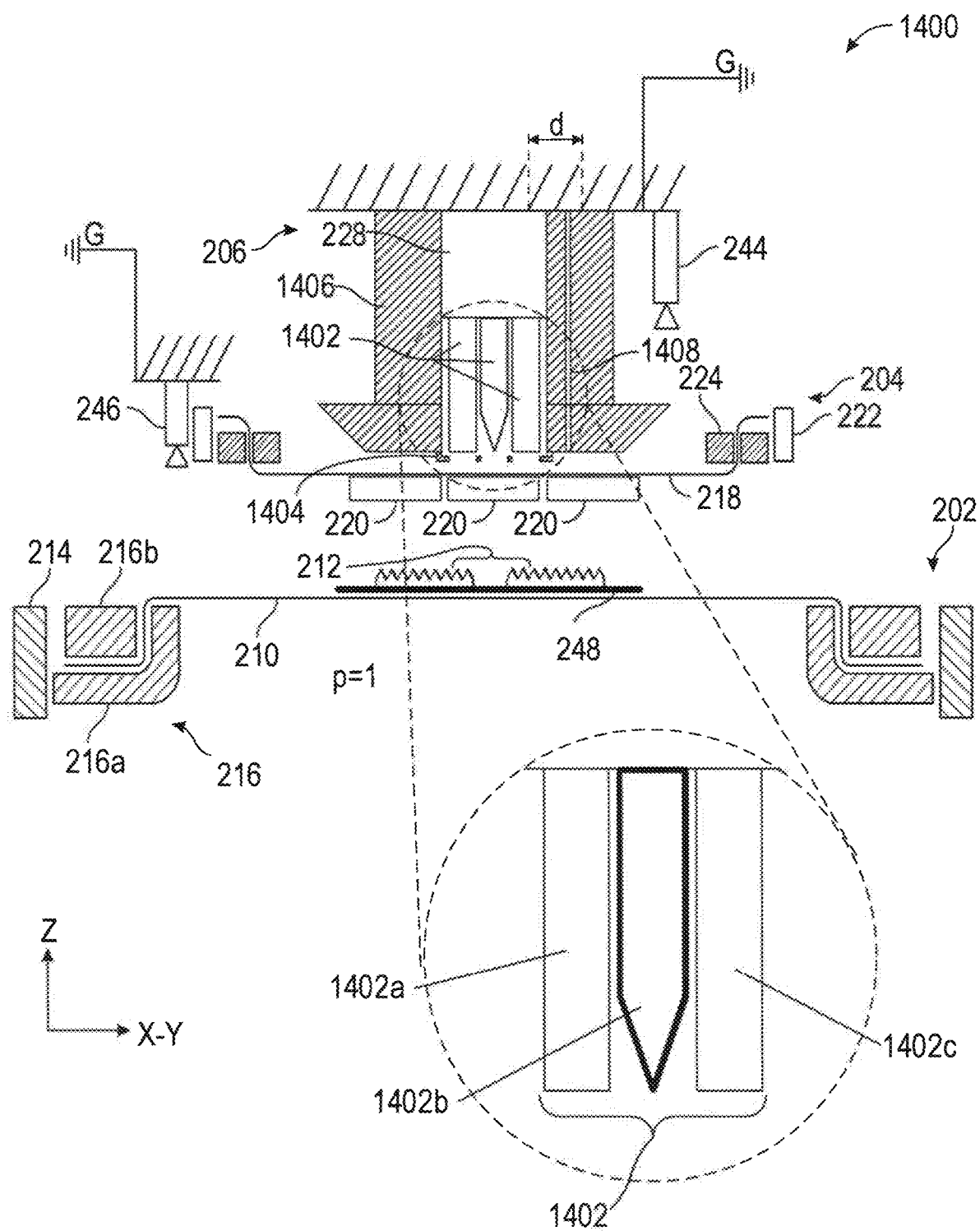
FIG. 14 illustrates a schematic view of another embodiment of a transfer apparatus having multiple needles in a pre-transfer position according to an embodiment of the instant application.

In another embodiment of a direct transfer apparatus, as seen in FIG. 14, a plurality of needles and a source of vacuum force may be used to assist in the direct transfer of semiconductor device die. While many features of apparatus 1400 may remain substantially similar to those of apparatus 200 in FIGS. 2A and 2B, some distinctions are discussed herein below with respect to FIGS. 14-20, including the implementation of multiple needles 1402 of the same or different types in a machine in order to transfer die 220, which may enable additional control of one or more transfer parameters. While described above as needles, the needles may also be referred to as impact wires, wires, or pins. Though depicting a set of three wires 1402 in FIG. 14, a machine implementing multiple wire technology may include two or more wires. For example, an embodiment of a direct transfer machine may include wires in quantities of 2, 3, 9, 24, etc., and anywhere between or greater than the example quantities. The wires 1402 may be formed of a material similar to the material of the needle 226 described above. For example, in view of the function and requirements of the wires 1402, the wires 1402 may be formed of a material that is sufficiently durable to withstand repetitive, rapid, minor impacts while minimizing potential harm to the die 220. For example, the wires 1402 may include a metal, a ceramic, a plastic, etc.

Regardless of the quantity of wires 1402, individual wires may be independently-actuatable, enabling individual wires to be actuated solitarily and/or sequentially, as well as in one or more groups. For example, each wire 1402 may be independently movable in the Z-direction, allowing each wire 1402 to actuate independently from the other wires. Additionally, and/or alternatively, in an embodiment, groups of wires may actuate at the same time. For example, as shown in FIG. 14, the transfer mechanism 206 may include one or more wires 1402b having a narrow wire tip profile (referred to and discussed further herein below as "transfer wires") and may also include one or more wires 1402a and 1402c having a relatively wider tip profile (referred to and discussed further herein below as "stabilizers"). The one or more wires 1402b having a narrow wire tip profile may actuate at a first time, while the one or more wires 1402a and 1402c having a relatively wider tip profile may actuate at a second time different from the first time.

Further to the description above, one or more wires 1402a and 1402c having a wider tip profile may be used as stability wires during the transfer process (described further herein below) and are referred to herein as "stabilizers." However, the stabilizers 1402a and 1402c are not necessarily limited for use to stabilize the actuation process and in some instances may be omitted entirely or may be used as additional transfer wires. In an embodiment, the stabilizers 1402a and 1402c may have a wire tip profile that is larger than, smaller than, or similar to the wire tip profile of the one or more transfer wires 1402b used in the transfer process. While FIG. 14 depicts the stabilizers 1402a and 1402c as having a substantially similar wire tip profile to each other, it is contemplated that in an embodiment not depicted, the stabilizers 1402a and 1402c may have substantially different wire tip profiles from each other. Further, while FIG. 14 depicts the transfer mechanism 206 as having two stabilizers 1402a and 1402c, the transfer mechanism 206 may include less than two stabilizers or more than two stabilizers. The stabilizers 1402a and 1402c may include a similar material or a different material than the material of the one or more transfer wires 1402b. Regardless of the size and/or material of the one or more stabilizers 1402a and 1402c, the stabilizers 1402a and 1402c may be used alongside the one or more transfer wires 1402b during the transfer process. This process is described further herein below with regard to FIGS. 14-20.

In an embodiment, the wires 1402 may be disposed and organized in a cluster. The cluster of wires 1402 may include a patterned cluster having wires spaced apart from each other at predetermined distances from one another, at least in an actuated position. For example, the wires may be positioned in a cluster such that the wires 1402 are arranged the same as or similar to the arrangement and orientation of impact wires (also known as impact pins) in a dot matrix impact printer head configuration. In an example embodiment, the wires 1402 may form an m×n matrix, wherein m and n include any real number. Typically, an m×n matrix may include m number of wires in a row and n number of wires in a column. For example, the cluster of wires 1402 may include a 3×1 matrix. In another non-limiting example (not shown), wires 1402 may be clustered in a 6×2 matrix, where there are six rows of wires 1402 and two columns of wires 1402. Such a "dot matrix" style configuration may include evenly spaced wires 1402. However, in an alternative embodiment, the cluster of wires 1402 may include irregularly spaced wires. Additionally, and/or alternatively, in an embodiment, the wires in a column may have a first spacing distance and the wires in a row may have a second spacing distance. Additionally, and or alternatively, in an embodiment, the transfer apparatus 1400 may include a frame (or "guide") (described further herein below) that may act to guide the cluster of wires 1402 to specific positions in the matrix. In an embodiment, the cluster of wires 1402 may be connected to a single actuator 228, as shown in FIG. 14. Additionally, and/or alternatively, each of, or predetermined groups of, the cluster of wires 1402 may be connected respectively to multiple actuators or multiple actuating elements (not shown). Notably, in any embodiment, the cluster of wires 1402 may include an actuating element for each individual wire, and the independently controllable actuating elements may be housed within a single actuator unit (e.g., like the impact wires in a dot matrix printer head). In such an embodiment, each actuating element may be communicatively coupled to a controller that is configured to activate the actuating elements.

As mentioned previously, the transfer apparatus 1400 may include a frame (referred to herein as a "guide") 1404 that may act to guide the cluster of needles 1402 to specific positions in the matrix configuration. In an embodiment, the guide may direct each individual wire of the cluster of wires 1402 to a respective opening in the guide 1404. Additionally, and/or alternatively, in an embodiment, the transfer apparatus 1400 may include a removable guide 1404 or may not include a guide 1404. In such an embodiment, the cluster of needles 1402 may actuate in a straight up and down direction, rather than being driven from a cluster and guided to a specific alignment out of the cluster formation with respective openings as shown in FIG. 14.

As shown in FIG. 14, a vacuum unit 1406 may be implemented in a machine as an additional aspect of control of one or more transfer parameters during the transfer of die 220. FIG. 14 depicts the vacuum unit 1406 in a cross sectional view so as to show the wires 1402 and the needle actuator 228. Vacuum unit 1406 may encompass the space surrounding the cluster of wires 1402 (needle/wire retention head (not depicted), needle/wire guide (not depicted), etc.). In an embodiment, the vacuum unit 1406 may be disposed such that it surrounds the needle actuator 228 and wires 1402. For example, the vacuum unit 1406 may form a cylinder around the needle actuator 228 and cluster of wires 1402. Further, the vacuum unit 1406 may be disposed adjacent to the cluster of wires 1402 and/or the needle actuator 228. The vacuum unit 1406 may be disposed such that it allows vertical movement of the wires 1402 and/or the needle actuator 228, and further disposed at a predetermined distance from the transfer location depending on other factors of the transfer process (e.g., size of die being transferred, timing, speed, etc.). An example use of vacuum unit 1406 is described next.

Vacuum unit 1406 may be used to assist in the transfer process. For example, the vacuum unit 1406 may increase the peel rate of the die 220 from the wafer tape 218, while dampening oscillation that may occur after the die 220 peels away from the wafer tape 218. This may be accomplished by disposing the vacuum unit 1406 such that it forms a seal on the wafer tape 218 during the transfer process. Additionally, and/or alternatively, in an embodiment, the vacuum unit 1406 may be disposed proximate to the wafer tape 218 such that it may assist in the peel rate of the die 220 from the wafer tape 218 without forming a seal.

In an embodiment, the vacuum unit 1406 may be dynamic in nature by including one or more vacuum capillaries 1408 disposed and spaced apart within the body of the vacuum unit 1406. For example, a cylindrical vacuum unit 1406 may include a plurality of vacuum capillaries 1408 spaced apart within the wall of the vacuum unit 1406 so as to create suction around multiple sides of the cluster of needles 1402. Additionally, and/or alternatively, in an embodiment, the one or more vacuum capillaries 1408 may be individually activated, thereby providing selective vacuum assistance as needed.

The stabilizers 1402a and 1402c and the vacuum unit 1406 may be used to affect a transfer parameter(s), such as peel angle, wafer tape tension, transfer speed, etc, during the transfer process. For example, actuation of the stabilizers 1402a and 1402c and implementation of vacuum pressure from vacuum unit 1406 against the wafer tape 218 may help control the peel angle of the die and/or optimize the tension of the wafer tape 218 during the transfer process. In another example, stability actuators 1402a and 1402c may relieve pressure imparted on the die 220 from the one or more transfer wires 1402b during the transfer process. That is, in the event that a die to be transferred has a lateral width that is significantly larger relative to the size of the wire tip profile of the one or more transfer wires 1402b, difficulties may arise when transferring die 220 of such distinct sizes. In such an event, the stabilizers 1402a and 1402c may be actuated to support outer edges of the die 220, thereby minimizing centrally-focused pressure on the die 220 during the transfer process.

An additional distinction from FIG. 2A is that support substrate 210 is configured to receive, support, and secure product substrate 248. In an embodiment, support substrate 210, as shown in FIG. 14, may be formed of a variety of materials having different properties (e.g., rigid, flexible, firm, soft, etc.) including metals, plastics, etc. Herein, the term "product substrate" (particularly with respect to "product substrate 248") may include, but is not limited to: a wafer tape (for example, to presort the dies and create sorted die sheets for future use); a paper or polymer substrate formed as a sheet or other non-planar shape, where the polymer—translucent or otherwise—may be selected from any suitable polymers, including, but not limited to: silicone, acrylic, polyester, polycarbonate, polyimide, etc.; a circuit board (such as a printed circuit board (PCB)); a string or thread circuit, which may include a pair of conductive wires or "threads" extending in parallel; and a cloth material of: cotton, nylon, rayon, leather, etc. The choice of material of product substrate 248 may include durable materials, flexible materials, rigid materials, and other materials with which the transfer process is successful and which maintain suitability for the end use of product substrate 248. Product substrate 248 may also be formed solely or at least partially of conductive material such that product substrate 248 may act as a conductive circuit for forming a product. Product substrate 248 may be thinner, thicker, or the same thickness as support substrate 210. The potential types of product substrate may further include items, such as glass bottles, vehicle windows, or sheets of glass.

Product substrate 248 may be secured to support substrate 210 through a plurality of methods so as to assist in the alignment aspect of the transfer process. Product substrate 248 may be secured to support substrate 210 during the transfer process via adhesive means, such as a tape or glue. Other means of securing product substrate 248 may include: static friction, suction, fusion, mechanical means, etc. Additionally, as mentioned previously, and in an embodiment, the product substrate may be secured via a system of holes in the support substrate that align with protrusions on the product substrate. Furthermore, product substrate 248 may be either permanently or temporarily affixed to support substrate 210. Inasmuch as product substrate is either permanently or temporarily affixed, support substrate is permitted to dampen forces associated with the transfer process.

Example Process of the Fifth Example Embodiment of a Direct Transfer Apparatus

FIG. 14 depicts the transfer apparatus 1400 in a first position in a sequence of positions during the transfer process. In an embodiment, the transfer process may be a high-speed transfer process. FIGS. 15-19 depict subsequent positions in the sequence of positions during the transfer process. For example, in FIG. 14, the first position is shown, and labeled for reference as p=1. At position p=1, the transfer mechanism 206 is depicted in a neutral state. This neutral state of the transfer mechanism 206 may be the state in which the transfer apparatus 1400 aligns the wires 1402 with the one or more die 220 for the transfer process.

Either prior to, or while being oriented in the neutral state at position p=1, data may be provided to the transfer apparatus 1400 to define a size of the one or more die 220. This data may dictate the actions executed by the elements of the transfer apparatus 1400 to accomplish the transfer of the die 220. Notably, the data describing the one or more die 220 may be loaded into the transfer apparatus 1400. In such an embodiment, the data may describe specific qualities and/or attributes of a particular die 220 at a position on the wafer tape 218. Additionally, and/or alternatively, the data regarding the size, quality, and/or, attributes of the die 220 may be determined by the sensors (previously discussed) of the transfer apparatus 1400. Regardless of the source of the data, when the wires 1402 are aligned with the one or more die 220, the particular operations executed by the transfer apparatus 1400 during a transfer may vary depending on the size of the one or more die 220, as provided in the data and relayed via the controller. The transfer apparatus 1400 may use this data to determine whether to engage the stabilizers 1402a and 1402c and/or the vacuum unit 1406, according to pre-programmed instructions. Additionally, and/or alternatively, in an embodiment, the size, thickness, material composition, and/or other aspects of other components (e.g., wafer tape, product substrate) in the transfer process may affect the manner of use of the wires 1402 and vacuum 1406 as well. For example, the thickness of the wafer tape 218 may be considered in determining whether to engage the stabilizers 1402a and 1402c and/or the vacuum unit 1406.

Figure 15:
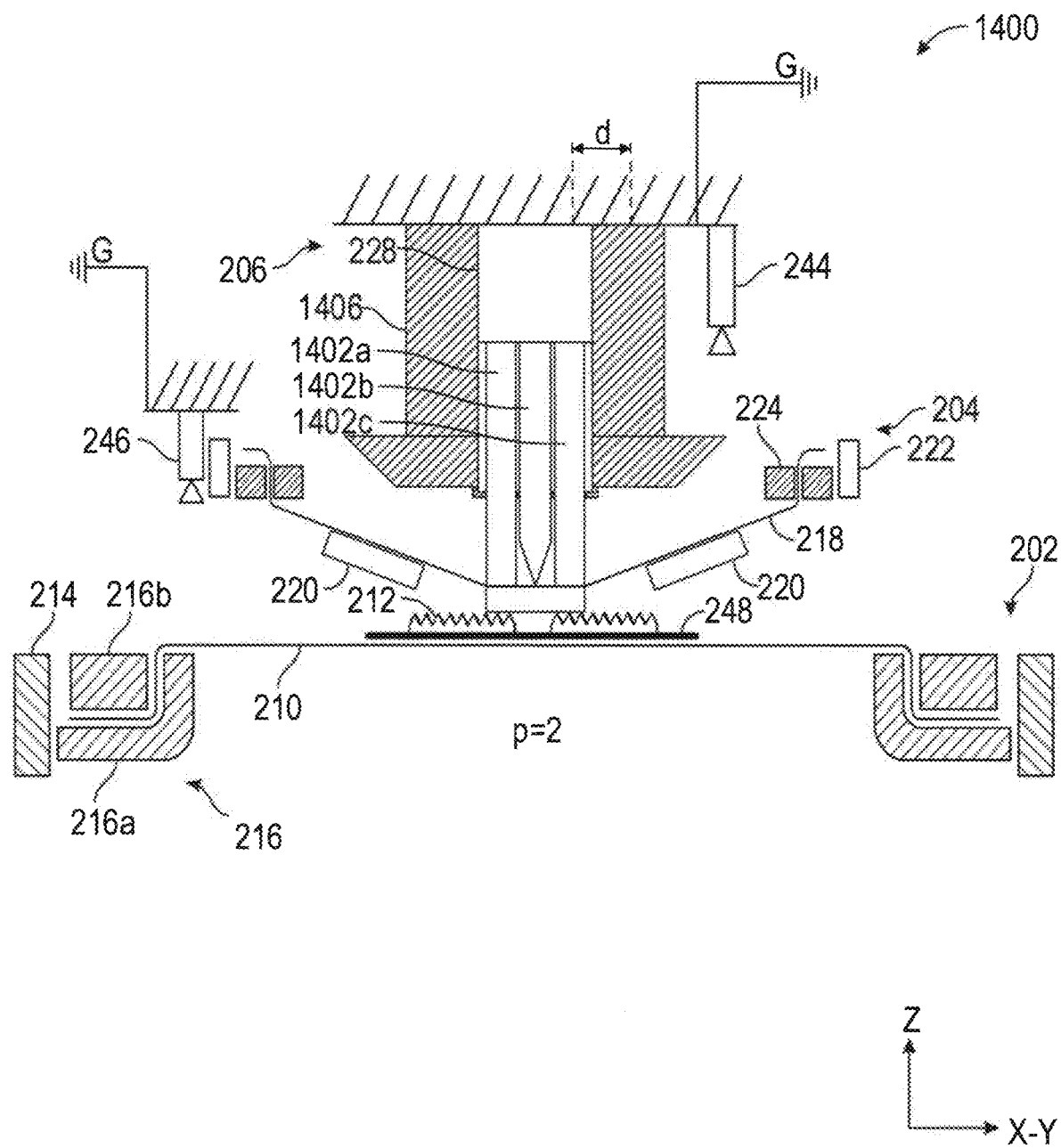
FIG. 15 illustrates a schematic view of the multiple needle transfer apparatus in a second position during a transfer operation according to an embodiment of the instant application.

FIG. 15 depicts the transfer apparatus 1400 at position p=2. At position p=2, the transfer mechanism 206 has been aligned with the die 220 and the transfer process begins. During this step of the process, the wires 1402 may actuate towards the die 220 at substantially the same time. In an embodiment where more than one wire and more than one stabilizer are to be used, a group of selected wires may be actuated together based on stability requirements needed for the size of the die being placed. For example, a larger die or an unstable die may benefit from actuation of more wires. Thus, in position p=2, the wires required in the transfer process, as determined above, actuate to a point such that the die 220 contacts the circuit trace 212.

Figure 16:
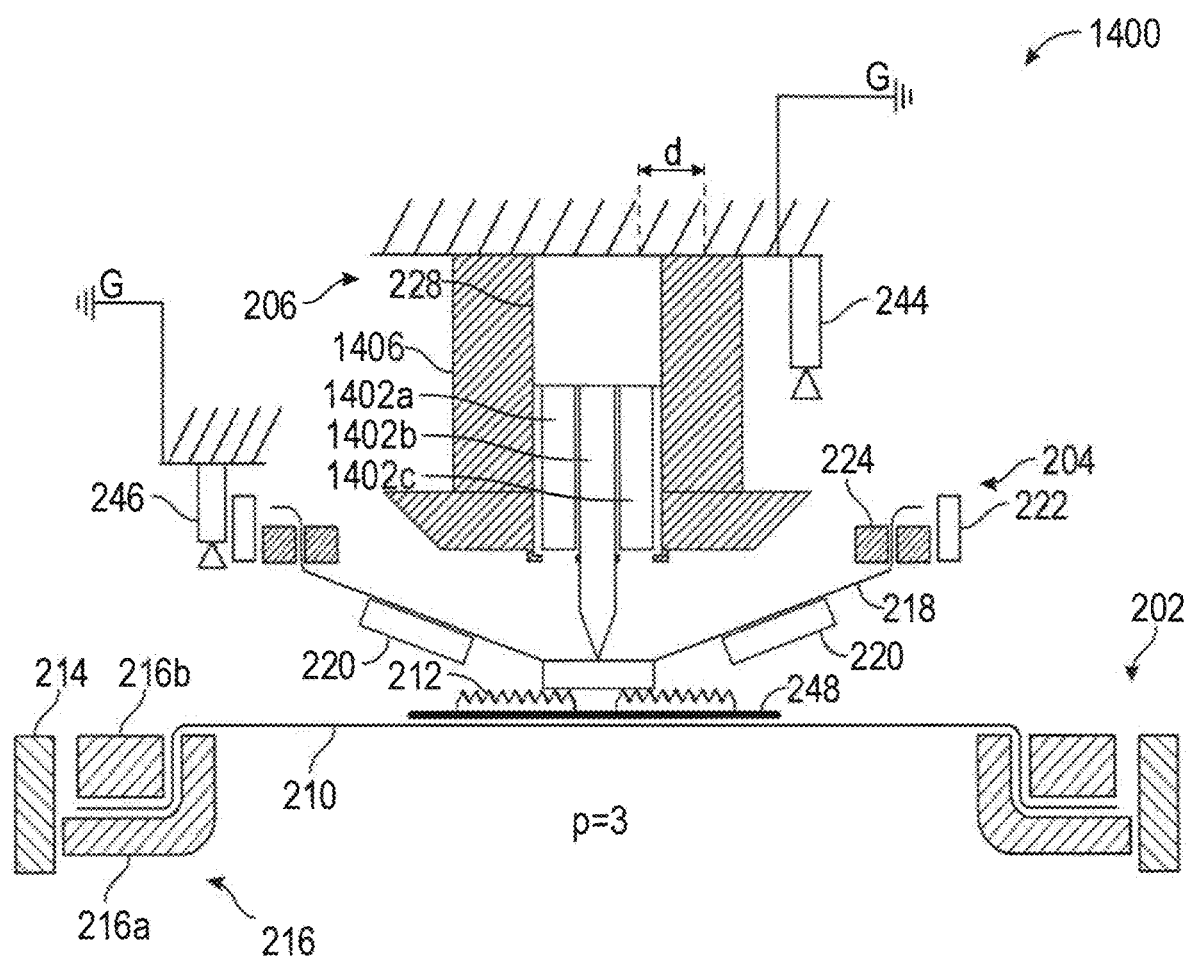
FIG. 16 illustrates a schematic view of the multiple needle transfer apparatus in a third position during a transfer operation according to an embodiment of the instant application.

FIG. 16 depicts the transfer apparatus 1400 at position p=3. Once the die 220 has contacted the circuit trace 212 below, the stabilizers 1402a and 1402c may immediately retract to a neutral position at p=3. However, in an embodiment, the stabilizers 1402a and 1402c may begin to retract prior to the die 220 contacting the circuit trace 212. Additionally, and/or alternatively, in an embodiment, the stabilizers 1402a and 1402c may delay retraction until a predetermined time of contact has elapsed. For example, the stabilizers 1402a and 1402c may delay retraction until a bond between the die 220 and the circuit trace 212 is assured. The retraction of the stabilizers 1402a and 1402c may act to reduce the surface area of contact on the wafer tape 218, thus increasing the tension between the wafer tape 218 and the die 220.

Figure 17:
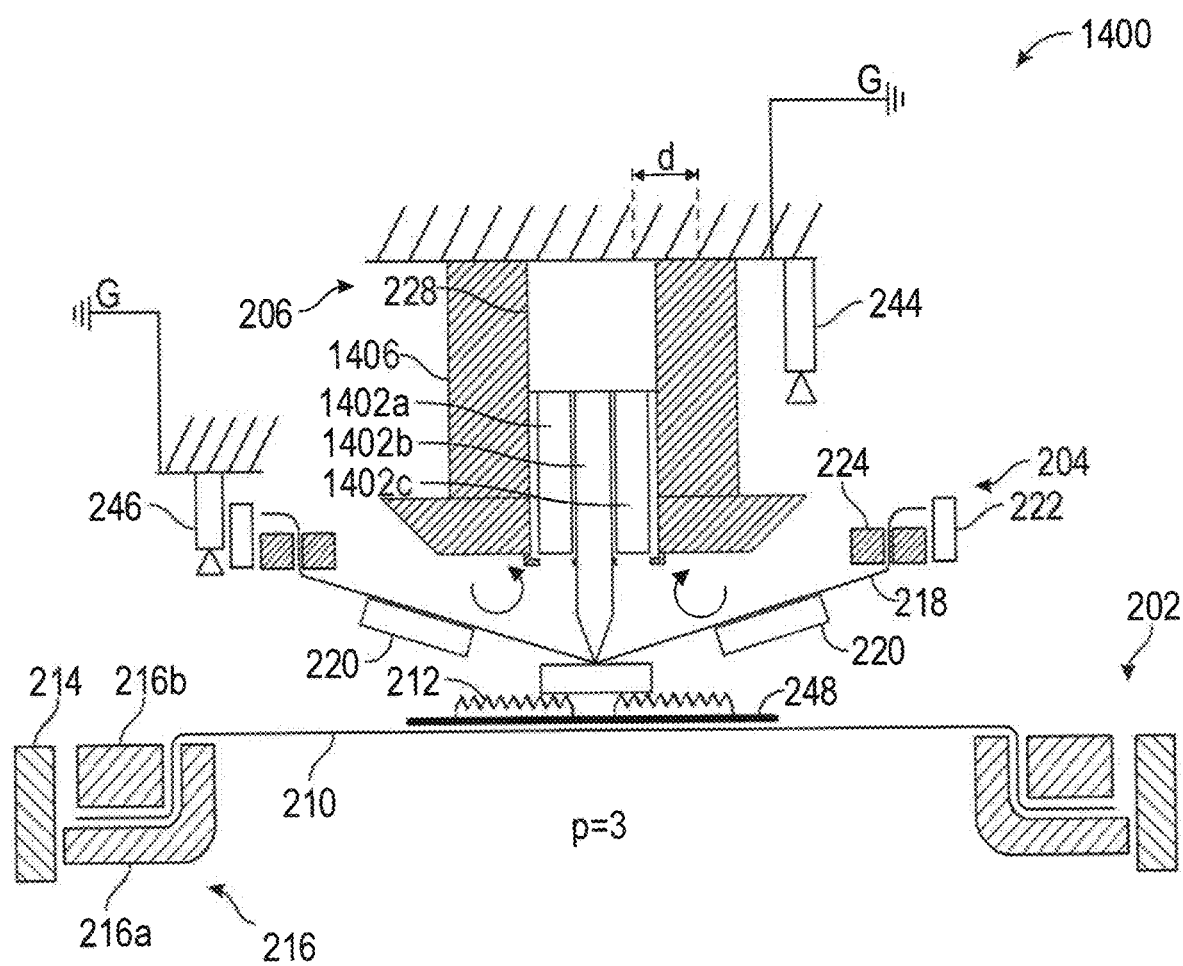
FIG. 17 further illustrates a schematic view of the multiple needle transfer apparatus in the third position of the transfer operation according to an embodiment of the instant application.

FIG. 17 further depicts the transfer apparatus 1400 at position p=3. Once the stabilizers 1402a and 1402c have been retracted, the wafer tape 218 may begin to peel from the die 220. During this initial peel process, the vacuum unit 1406 may be engaged to increase the peel rate, as indicated via the circular arrows depicted between the vacuum unit 1406 and the wafer tape 218. For example, engaging the vacuum unit 1406 may increase the peel angle and tension of the wafer tape 218 as it peels from the die 220, thereby accelerating the peel process. In an embodiment, the vacuum unit 1406 may be engaged at varying degrees depending on at least one of the size of the die 220, the type of wafer tape 218, the thickness of the wafer tape 218, etc. Additionally, and/or alternatively, as stated above, the vacuum unit 1406 may form a seal on the wafer tape 218. However, in other transfer processes, actuation of the vacuum unit 1406 may be omitted entirely.

Figure 18:
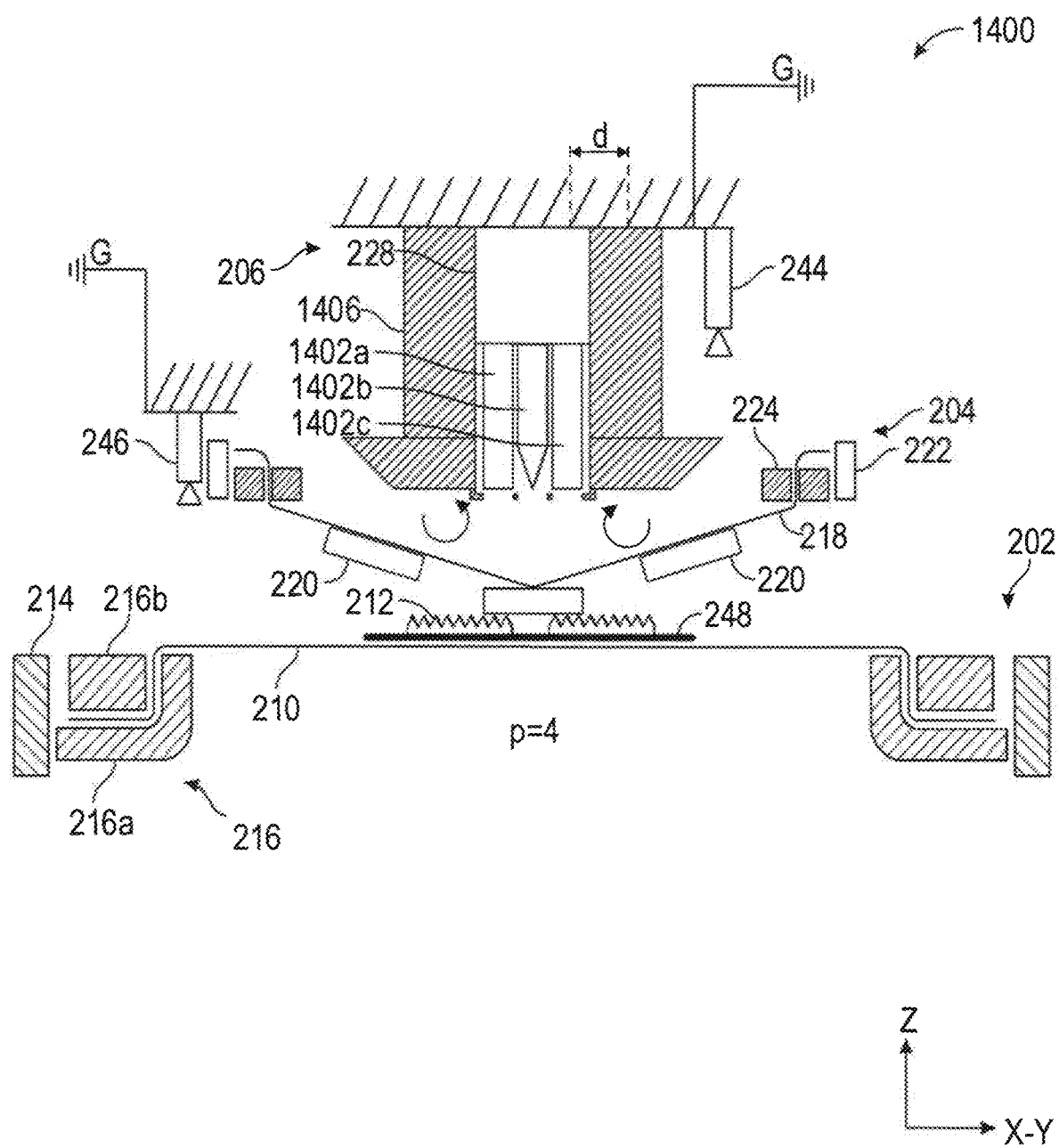
FIG. 18 illustrates a schematic view of the multiple needle transfer apparatus in a fourth, post-transfer position according to an embodiment of the instant application.

FIG. 18 depicts the transfer apparatus 1400 at position p=4. Once the initial peel of the wafer substrate 218 occurs, the one or more transfer wires 1402b may then be retracted. At this stage in the transfer process, the wafer substrate 218 may continue to peel from the die 220. The vacuum unit 1406 may continue to be engaged, as indicated via the circular arrows depicted between the vacuum unit 1406 and the wafer tape 218, while the transfer apparatus 1400 is in position p=4 to aide in the peel process.

Figure 19:
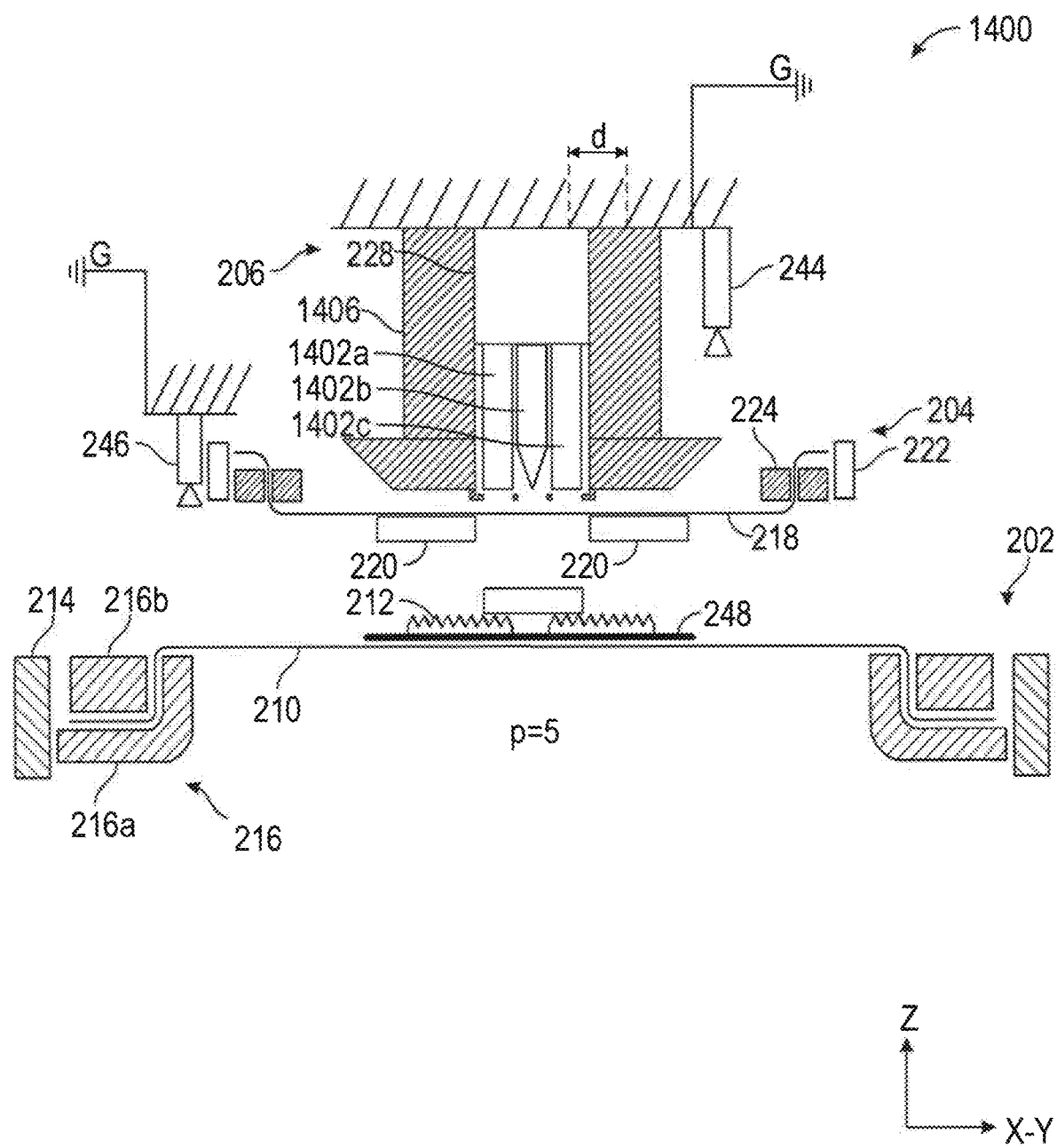
FIG. 19 illustrates a schematic view of the multiple needle transfer apparatus in a fifth, post-transfer position according to an embodiment of the instant application.

FIG. 19 depicts the transfer apparatus 1400 at position p=5. As the wafer tape 218 finishes the peeling process, the vacuum unit 1406 may continue to be engaged. This may minimize oscillation that may occur in the wafer tape 218 when the wafer tape 218 releases from the die 220. In an embodiment, the vacuum unit 1406 may be positioned such that the wafer tape 218 may contact the bottom of the vacuum unit 1406 after the wafer tape 218 releases from the die. While FIGS. 14-19 depict a gap between vacuum unit 1406 and the wafer tape 218, in an embodiment, this gap may not be present and the vacuum unit 1406 may contact the wafer tape 218. Additionally, and/or alternatively, in an embodiment, the vacuum unit 1406 may be disposed proximate to the wafer tape 218, for example, within a range of 0.5 mm to 2 mm, during the transfer process. Although the proximity may be less than 0.5 mm and/or greater than 2 mm as needed for varying attributes of a given transfer process.

Figure 20:
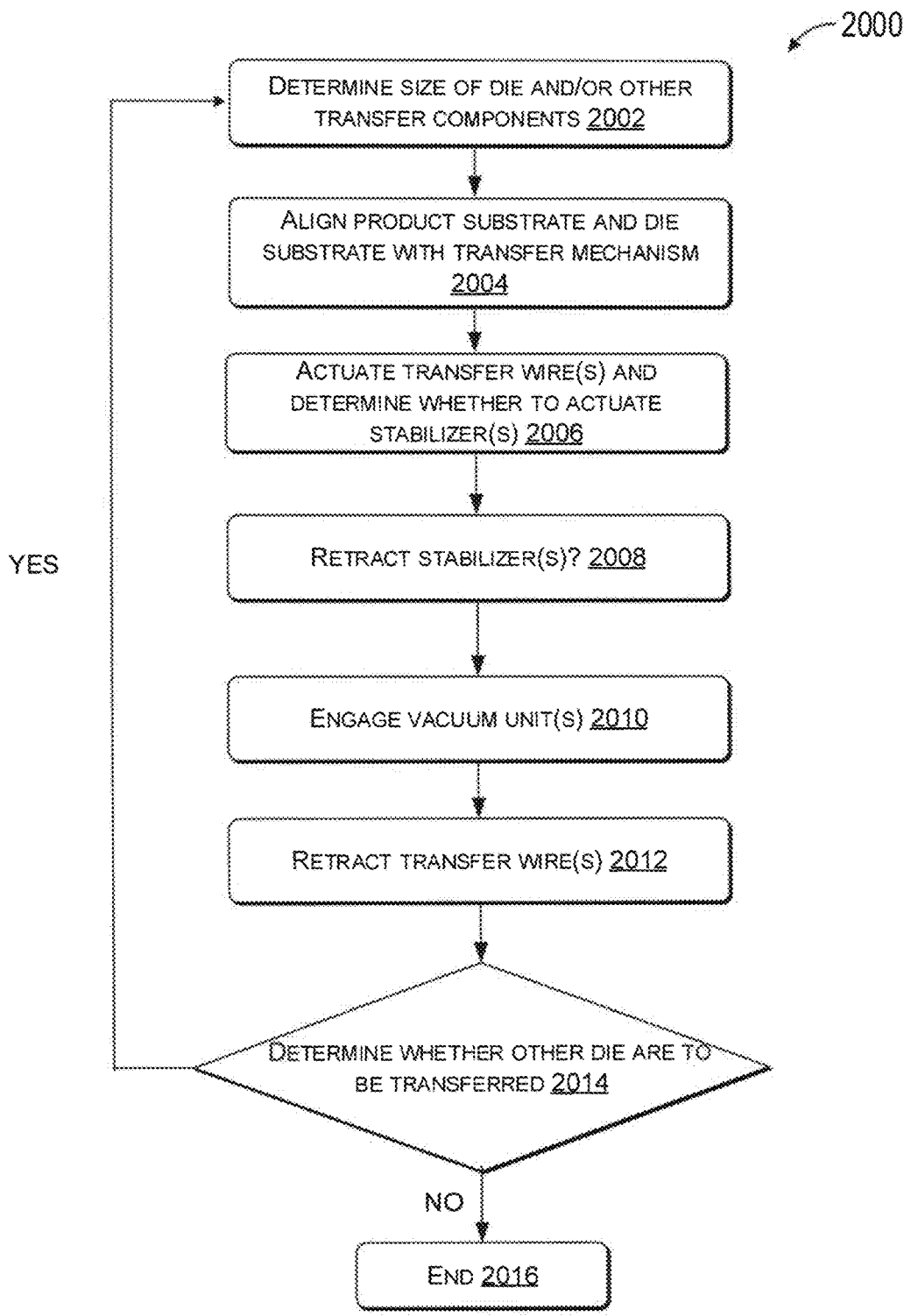
FIG. 20 illustrates a method for an example process of actuating a multiple needle transfer apparatus according to an embodiment of the instant application.

FIG. 20 depicts a method 2000 of a direct transfer operation of the fifth embodiment of the direct transfer apparatus. The steps of the method 2000 described herein may not be in any particular order and, as such, may be executed in any satisfactory order to achieve a desired product state. For ease of explanation, the process 2000 is described as being performed, at least in part, by the transfer apparatus 1400. The example method 2000 of the direct transfer operation (as well as each process described herein) is illustrated as a logical flow graph, each operation may represent a sequence of operations that may be implemented by hardware, software, a combination thereof, or may be operations implemented by one or more human users. In the context of software, the operations may represent computer-executable instructions stored on one or more computer-readable media that, when executed by one or more processors, perform the recited operations. Generally, computer-executable instructions may include routines, programs, objects, components, data structures, and the like that perform particular functions or implement particular abstract data types.

The computer-readable media may include non-transitory computer readable storage media, which may include hard drives, floppy diskettes, optical disks, CD-ROMs, DVDs, read-only memories (ROMs), random access memories (RAMs), EPROMS, EEPROMS, flash memory, magnetic or optical cards, solid-state memory devices, or other types of storage media suitable for storing electronic instructions. In addition, in an embodiment, the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, unless otherwise noted, the order in which the operations are described is not intended to be construed as a limitation, and any number of the described operations may be combined in any order and/or in parallel to implement the process.

At step 2002, data is obtained regarding a size of the semiconductor device die and/or one or more other components used during the transfer process. For example, preparations are made for the transfer process using data including one or more of: a size (i.e., thickness) of the wafer tape, the product substrate, the support substrate, the circuit trace, etc. As mentioned previously, the transfer apparatus may obtain a size of one or more components via data preloaded into the machine, via one or more sensors of the transfer apparatus, or other suitable means, such as parameters being input manually by an operator.

At step 2004, the PC (described herein above with respect to FIG. 7) may instruct the product substrate conveyance mechanism and the die substrate conveyance mechanism to convey the product substrate and the die substrate so as to align the substrates with the transfer mechanism. Additionally, and/or alternatively, in an embodiment, the PC may instruct the transfer mechanism to align with a transfer position corresponding to the product substrate and the die substrate.

At step 2006, one or more transfer wires may be actuated and it may be determined whether to actuate one or more stabilizers. The one or more transfer wires and the one or more stabilizers may actuate in a first direction toward the wafer tape such that at least one semiconductor device die contacts at least one circuit trace. Note, for convenience, the steps of method 2000 are discussed with respect to a transfer occurring from a wafer tape to a circuit trace on a product substrate. However, it is contemplated that some of the steps may vary slightly for different transfer situations including, but not limited to: transfers for sorting wafers (i.e., wafer to wafer), stacking semiconductor die, etc. In some instances, the one or more transfer wires and the one or more stabilizers may be actuated substantially concurrently in the first direction. However, in other instances, the one or more wires and the one or more stabilizers may be actuated sequentially. In an embodiment, the transfer process may not implement stabilizers. For example, depending on the size of the semiconductor device die as provided in the data at step 2002, stabilizers may not be used. Alternatively, the transfer process may employ a single stabilizer depending on the size of the semiconductor device die. In such an example, multiple thresholds may be implemented to determine a quantity of stabilizers to employ in the transfer process. For example, if the semiconductor device die size is below a first threshold the transfer process may not employ any stabilizers. However, if the semiconductor device die size is above the first threshold but below a second threshold, the transfer process may employ at least one stabilizer. And, finally, if the semiconductor device die size is determined to be above the second threshold, the transfer process may employ at least two stabilizers.

At step 2008, it is determined whether to retract the one or more stabilizers, if implemented in step 2006. Stabilizers, when used, are retracted in a second direction, opposite of the first direction and toward the transfer mechanism. In an embodiment, the one or more stabilizers may be retracted immediately after the semiconductor device die contacts a bonding surface of the circuit trace. This immediate retraction reduces the surface area of contact on the semiconductor device die and will encourage the die to peel from the wafer tape and this peeling process may continue further after the one or more stabilizers are retracted. Additionally, and/or alternatively, retraction of the one or more stabilizers may be delayed until a predetermined process and/or time period has been accomplished. For example, the transfer apparatus may retract the one or more stabilizers after the die has bonded to the circuit trace.

At step 2010, a vacuum unit may be engaged. The vacuum unit may be implemented to aid in accelerating the peel process. Once engaged, the vacuum unit may increase the peel angle and/or the tension of the wafer tape. This may increase the rate at which the wafer tape peels from the die. In an embodiment, the vacuum unit may be engaged while the one or more transfer wires are still in contact with the semiconductor device die. However, in another embodiment, the vacuum unit may be engaged after the one or more transfer wires have been retracted.

At step 2012, the transfer mechanism may retract the one or more transfer wires in the second direction, away from the wafer tape. In an embodiment, the one or more transfer wires may be retracted immediately after the wafer tape initially begins to peel from the semiconductor device die. In such an embodiment, the wafer tape will continue to peel while the vacuum unit is engaged and the one or more transfer wires have been retracted. Once the wafer tape completely peels from the semiconductor device die, the vacuum unit may stay engaged until oscillation in the wafer tape ceases and the wafer tape stabilizes.

At step 2014, it may be determined whether other semiconductor device die are to be transferred. If no other die are to be transferred, the process ends at step 2016. However, if it is determined that more die are to be transferred, the process may begin again at step 2002. Additionally, and/or alternatively, the process may begin at step 2006 if the transfer apparatus may skip steps 2002 and 2004. For example, steps 2002-2014 may be completed when transferring a first die, and may not complete steps 2002 and 2004 on subsequent die transfers. Additionally, and/or alternatively, in an embodiment, steps 2002 and 2004 may occasionally be completed during the transfer process to ensure proper transfer procedure when transferring a plurality of die from a wafer tape. In another embodiment, steps 2002 and 2004 may be completed for an entire wafer tape before and/or during the transfer of the die.

Example Clauses

A: A method for executing a direct transfer of one or more semiconductor device die from a wafer tape to a substrate, the method comprising: aligning the substrate and the wafer tape, via a support substrate conveyance mechanism and a die substrate conveyance mechanism respectively, into alignment with a transfer mechanism; actuating one or more transfer wires in a first direction toward the wafer tape, such that at least one semiconductor device die of the one or more semiconductor device die contacts at least one circuit trace; actuating two or more stabilizers in the first direction toward the wafer tape, such that the at least one semiconductor device die of the one or more semiconductor device die contacts the at least one circuit trace; retracting the two or more stabilizers in a second direction away from the wafer tape; and retracting, when peel of the at least one semiconductor device die from the wafer tape begins, the one or more transfer wires in the second direction.

B: The method according to paragraph A, wherein the method further comprises engaging, after retracting the two or more stabilizers, a vacuum unit to accelerate peeling of the wafer substrate from the at least one semiconductor device die.

C: The method according to any of paragraphs A-B, wherein the method further comprises determining a size of the at least one semiconductor device die, wherein the actuating the two or more stabilizers is based at least in part on determining the size of the at least one semiconductor device die.

D: The method according to any of paragraphs A-C, wherein engaging the vacuum unit is based at least in part on determining a size of the at least one semiconductor device die.

E: The method according to any of paragraphs A-D, wherein the method further comprises engaging the vacuum unit until the wafer tape ceases to oscillate after the at least one semiconductor device die is released.

Conclusion

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. An apparatus for executing a direct transfer of one or more semiconductor device die from a wafer tape to a substrate, the apparatus comprising:
a first frame configured to hold the wafer tape;
a second frame configured to secure the substrate such that a transfer surface is disposed facing the one or more semiconductor device die disposed on a first side of the wafer tape;
one or more transfer wires disposed adjacent a second side of the wafer tape opposite the first side, a length of the one or more transfer wires extending in a direction toward the wafer tape;
one or more stabilizers disposed adjacent the second side of the wafer tape, a length of the one or more stabilizers extending in a direction toward the wafer tape; and
a needle actuator configured to actuate the one or more transfer wires and the one or more stabilizers into a die transfer position at which at least one transfer wire and at least one stabilizer press on the second side of the wafer tape to press a semiconductor device die of the one or more semiconductor device die into contact with the transfer surface of the substrate.

2. The apparatus according to claim 1, wherein the apparatus includes two or more stabilizers.

3. The apparatus according to claim 2, wherein the needle actuator is configured to actuate the two or more stabilizers independently and simultaneously.

4. The apparatus according to claim 1, wherein the needle actuator is configured to actuate the one or more transfer wires and the one or more stabilizers in a first direction, the first direction being toward the wafer tape.

5. The apparatus according to claim 4, wherein the needle actuator is configured to actuate the one or more transfer needles and the one or more stabilizers concurrently in the first direction and sequentially in a second direction, the second direction being opposite the first direction.

6. The apparatus according to claim 1, wherein the needle actuator includes an electromechanical actuator.

7. The apparatus according to claim 1, wherein the apparatus further comprises a vacuum unit disposed adjacent the second side of the wafer tape, the vacuum unit being configured to engage during at least a portion of the direct transfer of the one or more semiconductor device die, wherein the vacuum unit is configured to remain engaged until the semiconductor device die is released from the wafer tape.

8. The apparatus according to claim 7, wherein the vacuum unit is configured to minimize oscillation of the wafer tape during the direct transfer.

* * * * *